United States Patent
Oi et al.

(10) Patent No.: US 9,307,641 B2
(45) Date of Patent: Apr. 5, 2016

(54) WIRING SUBSTRATE AND SEMICONDUCTOR DEVICE

(71) Applicant: SHINKO ELECTRIC INDUSTRIES CO., LTD., Nagano-shi (JP)

(72) Inventors: Kiyoshi Oi, Nagano (JP); Takashi Kurihara, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/633,525

(22) Filed: Feb. 27, 2015

(65) Prior Publication Data

US 2015/0250053 A1 Sep. 3, 2015

(30) Foreign Application Priority Data

Mar. 3, 2014 (JP) ................................. 2014-040092

(51) Int. Cl.
| | |
|---|---|
| H01L 23/12 | (2006.01) |
| H05K 1/11 | (2006.01) |
| H01L 23/498 | (2006.01) |
| H01L 23/00 | (2006.01) |
| H01L 25/065 | (2006.01) |
| H05K 1/02 | (2006.01) |

(52) U.S. Cl.
CPC .......... *H05K 1/111* (2013.01); *H01L 23/49822* (2013.01); *H01L 24/17* (2013.01); *H01L 25/0655* (2013.01); *H05K 1/0298* (2013.01); *H05K 1/112* (2013.01); *H01L 2224/16113* (2013.01); *H01L 2224/16225* (2013.01); *H01L 2224/16227* (2013.01); *H01L 2224/17104* (2013.01); *H01L 2224/32225* (2013.01); *H01L 2224/73204* (2013.01); *H01L 2924/12042* (2013.01); *H01L 2924/181* (2013.01)

(58) Field of Classification Search
CPC ................... H01L 23/5226; H01L 23/49822; H01L 23/3735; H01L 23/49827; H01L 23/49833; H01L 23/142; H01L 23/49861; H01L 2224/3225; H01L 2224/73204
USPC ......................... 257/700, 778, 787, E23.011, 257/E23.066–E23.069
See application file for complete search history.

(56) References Cited

U.S. PATENT DOCUMENTS

| | | | |
|---|---|---|---|
| 2008/0157331 A1 | 7/2008 | Onodera | |
| 2011/0308849 A1* | 12/2011 | Kondo et al. | ................. 174/260 |
| 2012/0153463 A1* | 6/2012 | Maeda | ................... H05K 1/115 257/737 |
| 2014/0120662 A1 | 5/2014 | Onodera | |

FOREIGN PATENT DOCUMENTS

| | | |
|---|---|---|
| JP | 2008-85373 A1 | 4/2008 |
| JP | 2008-166438 A1 | 7/2008 |

\* cited by examiner

*Primary Examiner* — Jasmine Clark
(74) *Attorney, Agent, or Firm* — Kratz, Quintos & Hanson, LLP

(57) ABSTRACT

A wiring substrate includes a first multi-layer wiring layer including an insulating layer formed of a non-photosensitive resin, a plurality of external connection pads formed on an upper face side of the first multi-layer wiring layer, and a second multi-layer wiring layer formed on the first multi-layer wiring layer, the second multi-layer wiring layer including an insulating layer formed of a photosensitive resin, the second multi-layer wiring layer having a wiring pitch narrower than the wiring pitch of the first multi-layer wiring layer. The external connection pads are exposed from the insulating layer of the second multi-layer wiring layer.

7 Claims, 21 Drawing Sheets

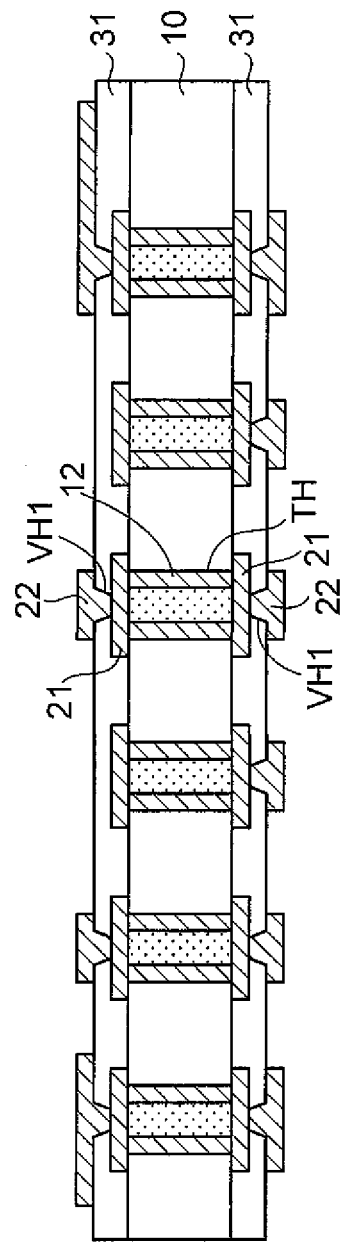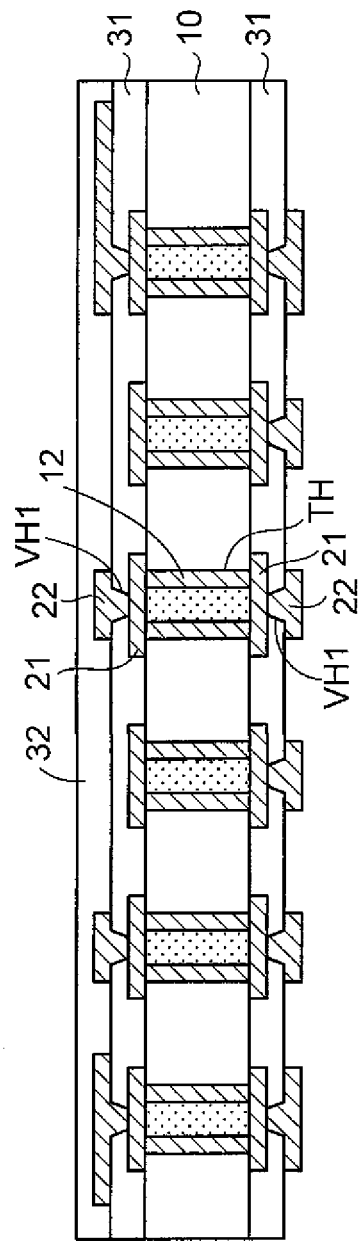
FIG. 3A
FIG. 3B

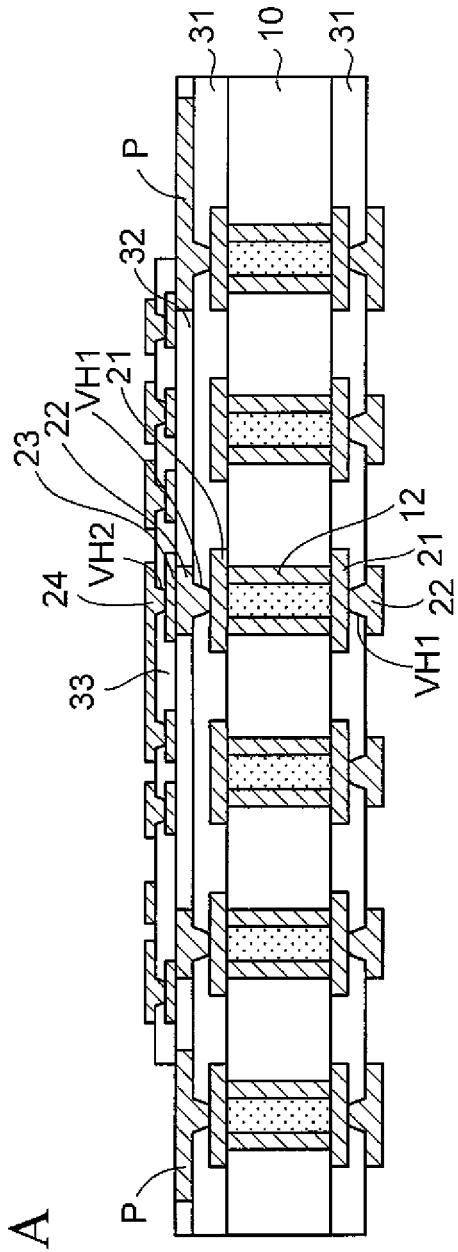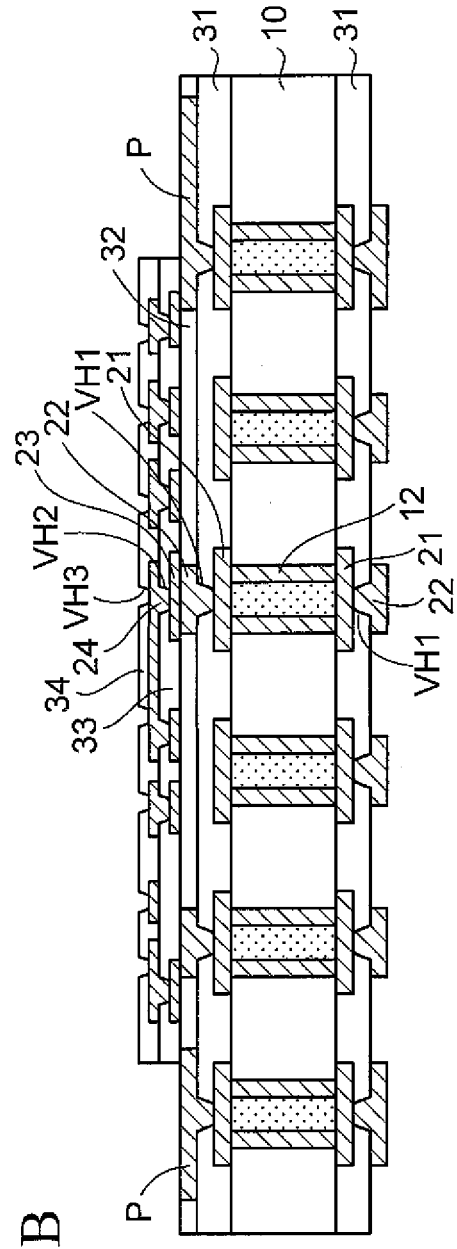

WIRING SUBSTRATE AND SEMICONDUCTOR DEVICE

CROSS-REFERENCE TO RELATED APPLICATIONS

This application is based upon and claims the benefit of priority of the prior Japanese Patent Application No. 2014-040092, filed on Mar. 3, 2014, the entire contents of which are incorporated herein by reference.

FIELD

This invention is related to a wiring substrate, a method of manufacturing the same, and a semiconductor device.

BACKGROUND ART

In recent years, with the advancement in the performance of the semiconductor devices, the higher density of the mounting technology has been advanced. As a technology to connect the semiconductor chip to the wiring substrate, the flip-chip connection has been widely used. In the flip-chip connection, bump electrodes of the semiconductor chip are connected to electrodes of the wiring substrate through solder.

Further, the semiconductor device has been developed in which an upper wiring substrate is connected onto the wiring substrate through bump electrodes so as to house the semiconductor chip on the wiring substrate.

A related art is disclosed in Japanese Laid-open Patent Publication No. 2008-85373 and Japanese Laid-open Patent Publication No. 2008-166438.

SUMMARY

As will be explained in the section of a preliminary matter given below, in a stacked-type semiconductor device as depicted in FIG. 1, a lower wiring substrate 100 is manufactured by using a general buildup technique. Therefore, in line (width):space (interval) ratio of second wiring layers 320, about 10 μm:10 μm is a limit value. For this reason, it cannot easily respond to a demand to flip-chip connecting high-performance semiconductor chips having narrow-pitch connection terminals side by side to the lateral direction.

Moreover, even if fine wirings of the thin film can be formed in the lower wiring substrate 100, because the external connection pads P are also formed from the same layer as the fine wirings, there is a problem in which sufficient mechanical strength of the external connection pads P cannot be obtained.

According to one aspect discussed herein, there is provided a wiring substrate, including a first multi-layer wiring layer including an insulating layer formed of a non-photosensitive resin, a plurality of external connection pads formed on an upper face side of the first multi-layer wiring layer, and a second multi-layer wiring layer formed on the first multi-layer wiring layer, the second multi-layer wiring layer including an insulating layer formed of a photosensitive resin, the second multi-layer wiring layer having a wiring pitch narrower than a wiring pitch of the first multi-layer wiring layer, wherein the external connection pads are exposed from the insulating layer of the second multi-layer wiring layer.

Also, according to another aspect discussed herein, there is provided a method of manufacturing a wiring substrate, including forming a first multi-layer wiring layer including an external connection pad on an upper face side by a method including a technique in which a first via hole is formed in an insulating layer formed of a non-photosensitive resin by a laser, and forming a second multi-layer wiring layer on the first multi-layer wiring layer such that the external connection pad is exposed, by a method including a technique in which an insulating layer including a second via hole is formed by patterning a photosensitive resin by means of photolithography, wherein a wiring pitch of the second multi-layer wiring layer is set narrower than a wiring pitch of the first multi-layer wiring layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A and 3B are cross-sectional views depicting the method of manufacturing a wiring substrate of the embodiment (part 2).

FIGS. 8A and 8B are cross-sectional views depicting the method of manufacturing a wiring substrate of the embodiment (part 7).

DESCRIPTION OF EMBODIMENTS

Hereinbelow, embodiments will be explained with reference to the accompanying drawings.

Figure 1:
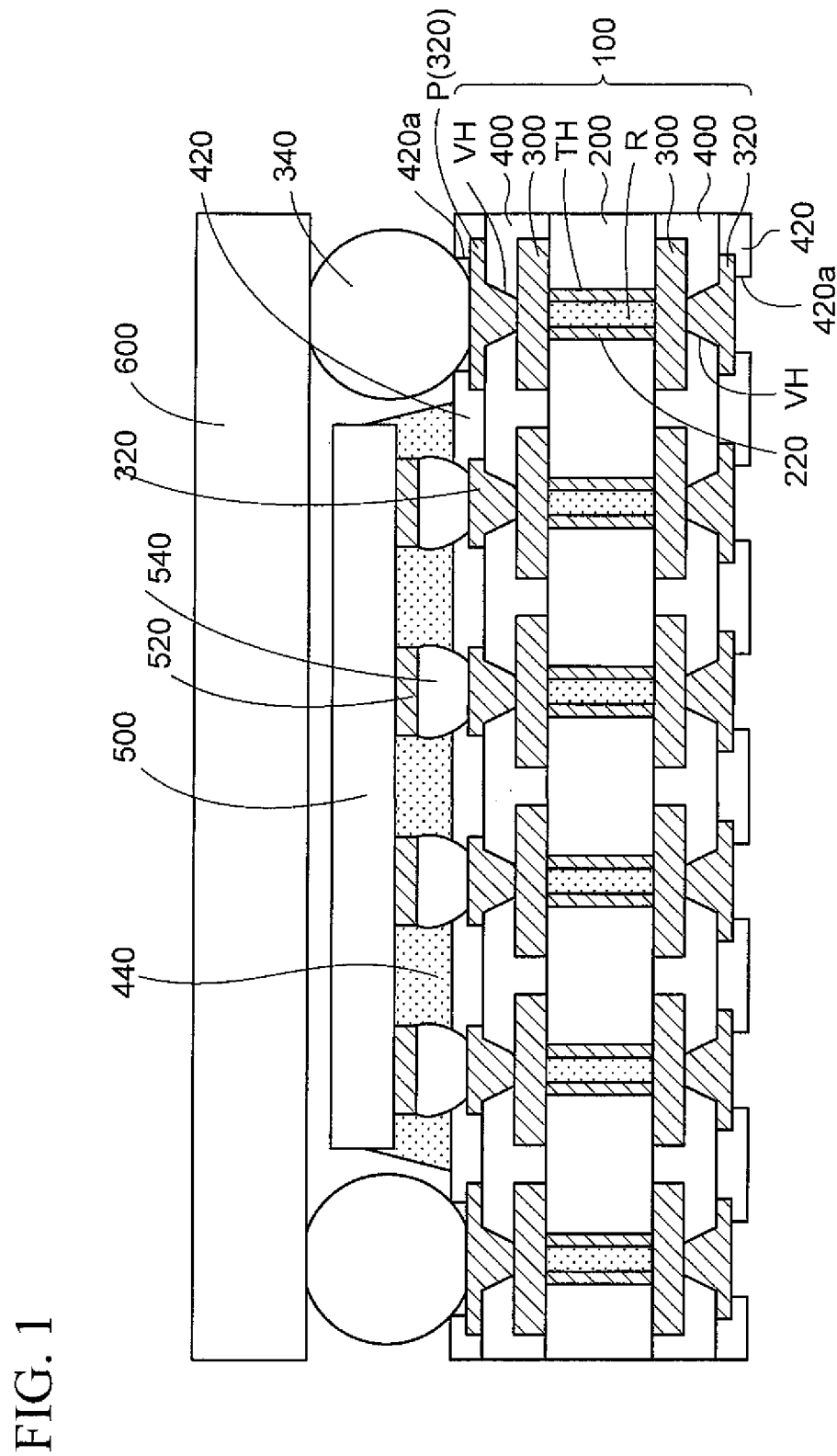
FIG. 1 is a cross-sectional view depicting a semiconductor device according to a preliminary matter.

Prior to the explanation of the embodiments, the preliminary matter to be set forth as a basis will be explained hereunder. FIG. 1 is a cross-sectional view depicting a semiconductor device according to the preliminary matter.

As depicted in FIG. 1, a lower wiring substrate 100 of the semiconductor device according to the preliminary matter includes a core substrate 200 in a center part in the thickness direction. First wiring layers 300 are formed on both faces of the core substrate 200 respectively.

Through-holes TH are formed in the core substrate 200, and a through-hole plating layer 220 is formed on an inner wall of the through-holes TH. The first wiring layers 300 on both face sides of the core substrate 200 are connected each other through the through-hole plating layers 220. Moreover, resin bodies R are filled in the remaining holes of the through-holes TH.

Interlayer insulating layers 400 are formed respectively on both face sides of the core substrate 200 and include via holes VH reaching the first wiring layers 300. Further, second wiring layers 320 are formed on the interlayer insulating layers 400 on both face sides respectively and connected to the first wiring layers 300 through the via holes VH. The second wiring layers 320 are formed to include external connection pads P arranged in a periphery part of the lower wiring substrate 100.

Moreover, solder resist layers 420 are formed respectively on the interlayer insulating layers 400 on both face sides, the solder resist layers 42 in which opening portions 420a are provided on connection parts of the second wiring layers 320 on both face sides and on the external connection pads P on the upper face side.

Then, connection terminals 520 of a semiconductor chip 500 are flip-chip connected to the connection parts of the second wiring layers 320 on the upper face side of the core substrate 200 through solder layers 540. An underfill resin 440 is filled between the semiconductor chip 500 and the lower wiring substrate 100.

Further, an upper wiring substrate 600 is connected to the external connection pads P arranged in the periphery of the lower wiring substrate 100 through bump electrodes 340. In this way, the upper wiring substrate 600 is stacked on the lower wiring substrate 100 and the semiconductor chip 500, and the semiconductor chip 500 is housed in a lower region of the upper wiring substrate 600.

The lower wiring substrate 100 of the semiconductor device of the preliminary matter is manufactured by a general buildup-wiring forming method. For this reason, in line (width):space (interval) ratio of the second wiring layers 320, about 10 μm:10 μm is a limit value. Thus, the second wiring layers 320 are formed with a relatively loose design rule.

In recent years, with the advancement in the performance of semiconductor chips, the narrower pitch of connection terminals of semiconductor chips has been advanced. Then, there is a demand to mount a semiconductor chip having high density connection terminals to the region in FIG. 1 where the semiconductor chip 500 is mounted. Further, there is a demand to mount two semiconductor chips having high density connection terminals side by side and to connect these semiconductor chips each other.

However, in the method of manufacturing the lower wiring substrate 100 of the semiconductor device of the preliminary matter, it is difficult that the wiring layers are made minute any more. Therefore, there is a problem in which it cannot respond to the demand to mount a semiconductor chip(s) having high density connection terminals.

Moreover, even if fine wirings of the thin film can be formed in the lower wiring substrate 100, because the external connection pads P are also formed as the same layer as the fine wirings, the external connection pads P are formed as the pads of the thin film. For this reason, when the upper wiring substrate 600 is connected to the external connection pads P of the lower wiring substrate 100 through the bump electrodes 340, since the mechanical strength of the external connection pads P is weak, the cracking or the like is likely to occur in the external connection pads P. This leads to a problem in which the reliability of the connection is decreased.

Wiring substrates and methods of manufacturing the same of the embodiments to be explained below can solve the above problems.

Embodiment

FIG. 2A to FIG. 9E are views depicting a method of manufacturing a wiring substrate of an embodiment. FIG. 10 is a view depicting a wiring substrate of the embodiment. FIG. 11 to FIG. 18 are views for explaining semiconductor devices using the wiring substrate in FIG. 10.

Hereinbelow, while explaining the wiring substrate and a method of manufacturing a semiconductor device, the structures of the wiring substrate and semiconductor device will be explained.

First of all, a method of forming a first multi-layer wiring layer which serves as a base substrate of the wiring substrate of this embodiment will be explained. In this embodiment, the first multi-layer wiring layer is formed of a buildup wiring substrate.

Figure 2A:
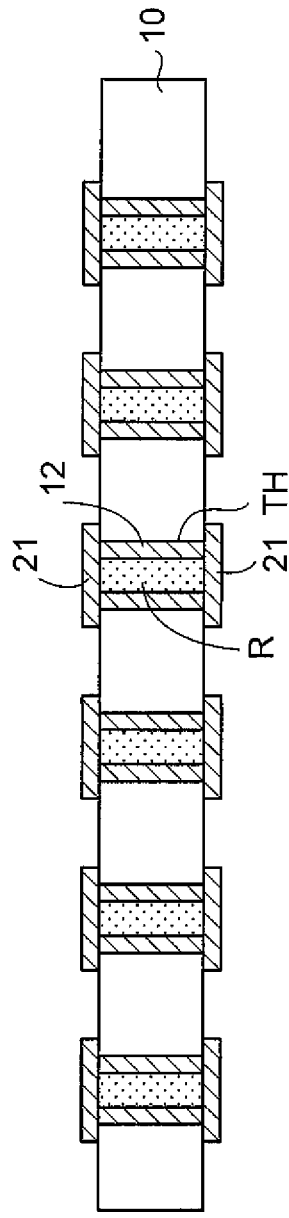
FIGS. 2A and 2B are cross-sectional views depicting a method of manufacturing a wiring substrate of an embodiment (part 1).

First, a core substrate 10 having a structure as depicted in FIG. 2A is prepared. Through-holes TH are formed in the core substrate 10 and penetrate to the thickness direction, and a through-hole plating layer 12 is formed on an inner wall of the through-holes TH. The core substrate 10 is formed of an insulating material such as a glass epoxy resin or the like.

Moreover, first wiring layers 21 are formed on both face sides of the core substrate 10 respectively. The first wiring layers 21 on both face sides are connected each other through the through-hole plating layers 12. Resin bodies R are filled in the remaining holes of the through-holes TH.

The through-holes TH of the core substrate 10 are formed by a drill or the like. Moreover, the through-hole plating layers 12 and the first wiring layers 21 formed to the core substrate 10 are formed by using plating method, photolithography, or the like.

Figure 2B:
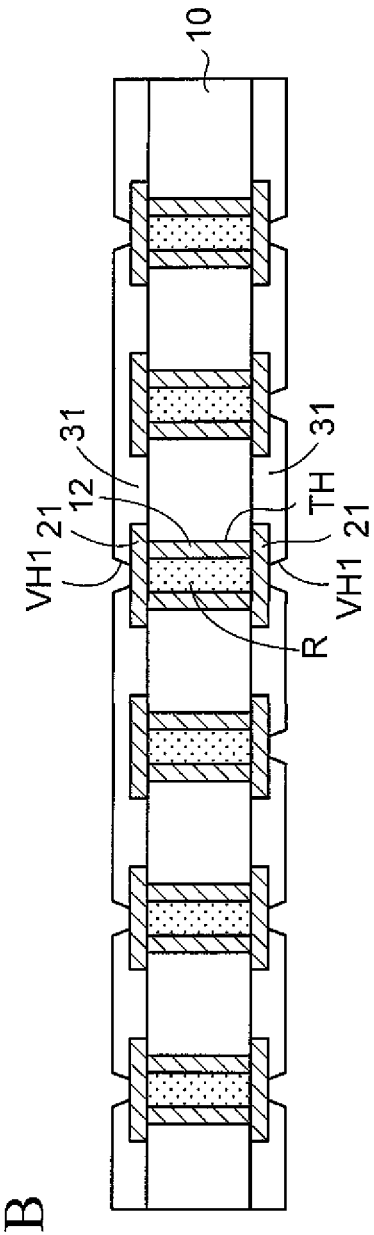

Then, as depicted in FIG. 2B, uncured resin films are attached to both face sides of the core substrate 10 and cured by a heat process, thereby first interlayer insulating layers 31 are formed on both face sides respectively.

Thereafter, the first interlayer insulating layers 31 on both face sides are processed by a laser, thereby first via holes VH1 are formed in the first interlayer insulating layers 31, the first via holes VH which reach connection parts of the first wiring layers 21 on both face sides respectively.

In this technique, since the first via holes VH1 are formed by the laser, the first interlayer insulating layers 31 are formed of a non-photosensitive resin. An epoxy resin, a polyimide resin, or the like is used as the resin material. For example, the thickness of the first interlayer insulating layers 31 is about 10 μm to 20 μm, and the diameter of the first via holes VH1 is about 30 μm to 50 μm.

Further, a desmear treatment is performed on the inside of the first via holes VH1 by a permanganate method or the like to remove resin smears and clean the first via holes VH1.

Then, as depicted in FIG. 3A, second wiring layers 22 are formed on the first interlayer insulating layers 31 on both face sides, the second wiring layers 22 which are connected to the first wiring layers 21 through via conductors in the first via holes VH1. The second wiring layers 22 are formed by a semi-additive method.

Figure 4A:
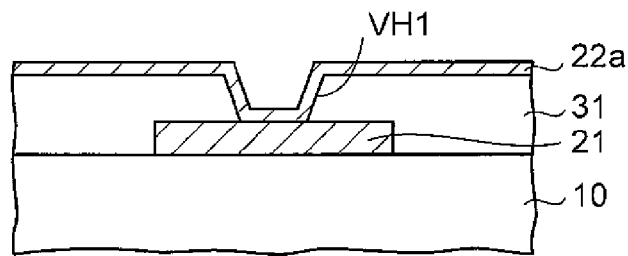
FIGS. 4A to 4E are cross-sectional views depicting the method of manufacturing a wiring substrate of the embodiment (part 3).

As explained in detail, as depicted in FIG. 4A, a seed layer 22a made of copper or the like and having a thickness of about 1 μm is formed on the first interlayer insulating layer 31 and inner faces of the first via holes VH1 by electroless plating.

Figure 4B:
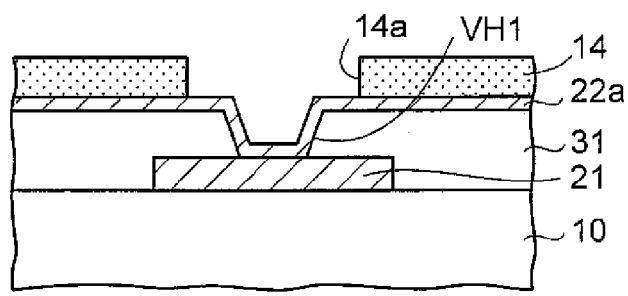

Then, as depicted in FIG. 4B, a plating resist layer 14 is formed on the seed layer, the plating resist layer 22a in which opening portions 14a are provided on parts where the second wiring layers 22 are to be arranged.

Figure 4C:
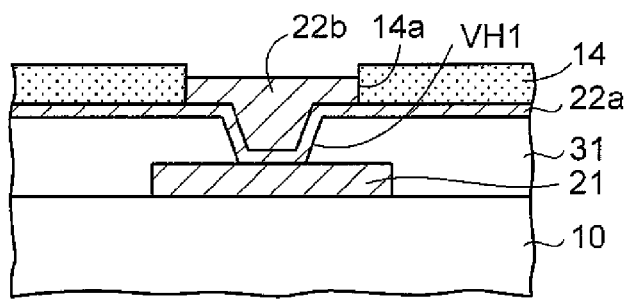
Figure 4D:
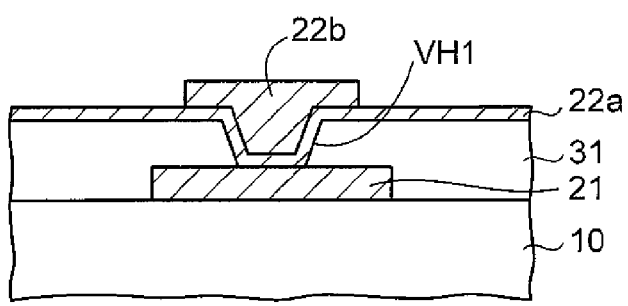

Thereafter, as depicted in FIG. 4C, a metal plating layer 22b made of copper or the like and having a thickness of about 10 μm is formed in the opening portion 14a of the plating resist layer 14 by electroplating utilizing the seed layer 22a as a plating power feeding path. Then, as depicted in FIG. 4D, the plating resist layer 14 is removed.

Figure 4E:
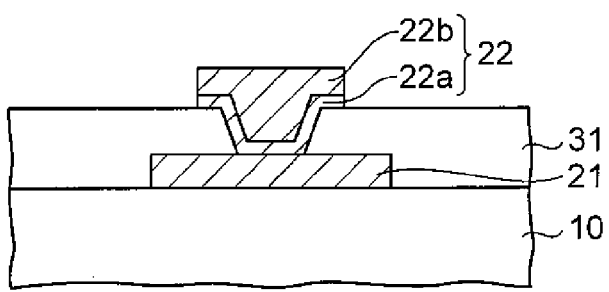

Further, as depicted in FIG. 4E, the seed layer 22a is removed by wet etching while using the metal plating layer 22b as a mask. By this matter, the second wiring layers 22 are formed from the seed layer 22a and the metal plating layer 22b.

Then, referring back to FIG. 3, an uncured resin film is attached on the first interlayer insulating layer 31 and the second wiring layers 22 on the upper face side of the core substrate 10 and cured by performing a heat process, thereby a second interlayer insulating layer 32 is formed.

Figure 5:
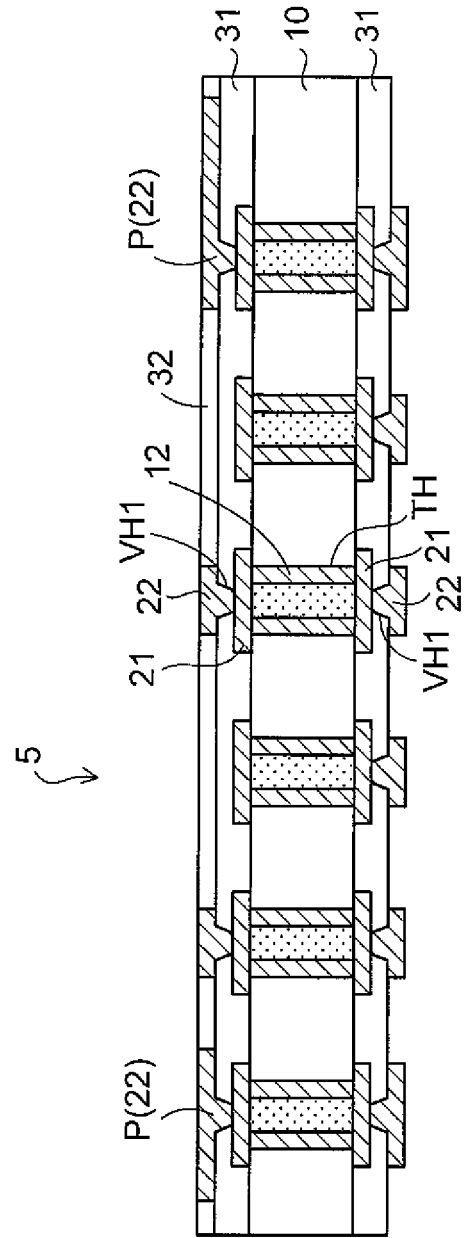
FIG. 5 is a cross-sectional view depicting the method of manufacturing a wiring substrate of the embodiment (part 4).

Thereafter, as depicted in FIG. 5, the second interlayer insulating layer 32 is polished by CMP (Chemical Mechanical Polishing) until upper faces of the second wiring layers 22 are exposed. By this matter, the upper faces of the second wiring layers 22 and an upper face of the second interlayer insulating layer 32 constitute an identical face.

By the above steps, a first multi-layer wiring layer 5 is obtained which is formed of the buildup wiring substrate and serves as the base substrate of the semiconductor device of this embodiment. The second wiring layers 22 located in a periphery part in the first multi-layer wiring layer 5 are formed as external connection pads P. In this way, the plurality of external connection pads P are arranged side by side in an annular periphery part of an upper face side of the first multi-layer wiring layer 5.

In the case of using a large substrate for the multi production as the first multi-layer wiring layer 5, a plurality of chip mounting regions are defined in the first multi-layer wiring layer 5. FIG. 5 depicts one chip mounting region of the first multi-layer wiring layer 5, and the inner region from the external connection pads P is the chip mounting region.

Next, a method of forming a second multi-layer wiring layer on the first multi-layer wiring layer 5 will be explained, the second multi-layer wiring layer which has a narrower wiring pitch than the wiring pitch of the second wiring layers 22.

Figure 6A:
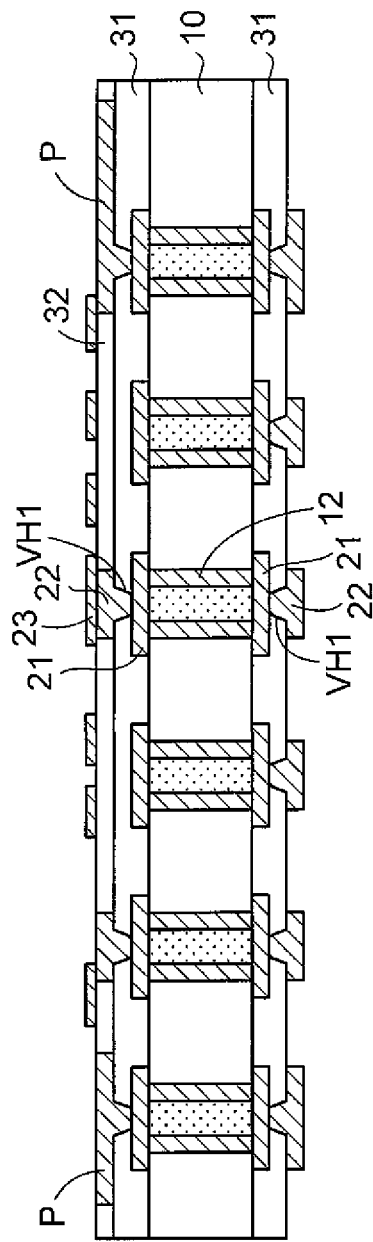
FIGS. 6A and 6B are cross-sectional views depicting the method of manufacturing a wiring substrate of the embodiment (part 5).
Figure 6B:
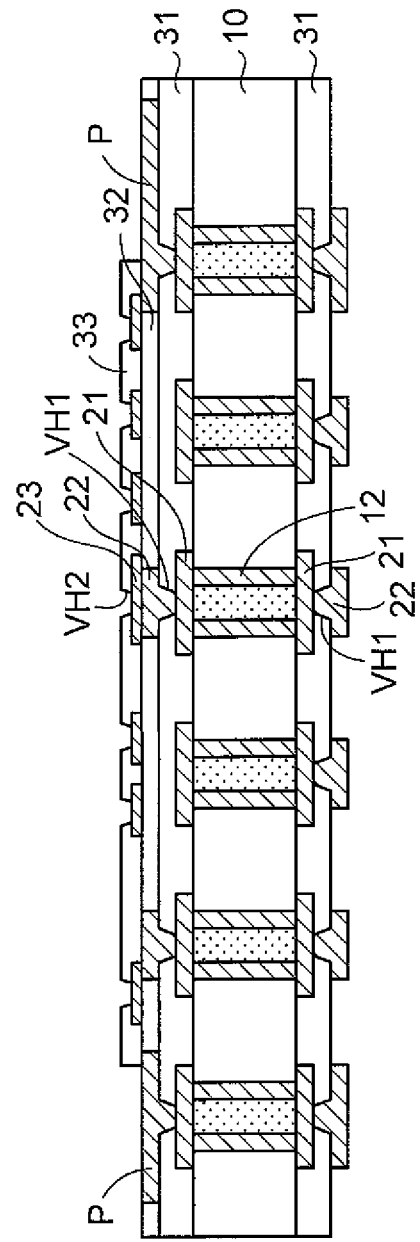
Figure 7A:
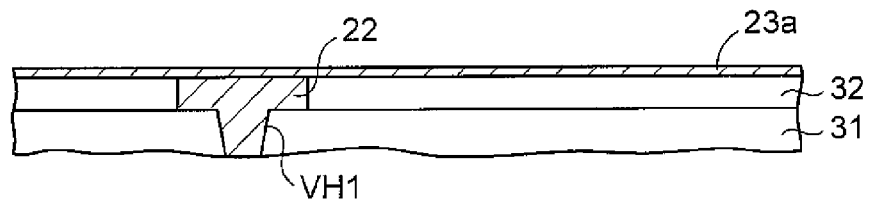
FIGS. 7A to 7E are cross-sectional views depicting the method of manufacturing a wiring substrate of the embodiment (part 6).

As depicted in FIG. 6A, first, third wiring layers 23 are formed on the second interlayer insulating layer 32 of the first multi-layer wiring layer 5, the third wiring layers 23 which are connected to the second wiring layers 22. The third wiring layers 23 are formed by the semi-additive method. As explained in detail, as depicted in FIG. 7A, a seed layer 23a is formed on the second interlayer insulating layer 32 and the second wiring layers 22 by sputtering.

As one example of the seed layer 23a, a titanium (Ti) layer having a thickness of 0.05 μm and a copper (Cu) layer having a thickness of 0.5 μm are formed in this order from the lower side.

Figure 7B:
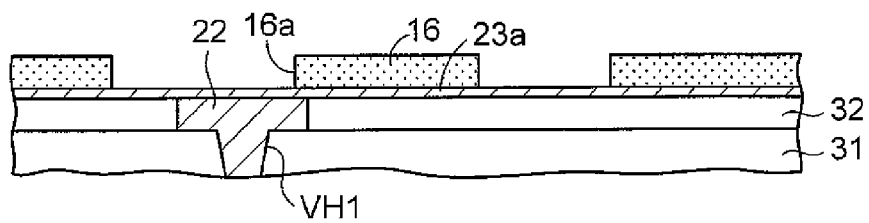

Then, as depicted in FIG. 7B, a plating resist layer 16 is formed on the seed layer 23a, the plating resist layer 16 in which opening portions 16a are provided on the parts where the third wiring layers 23 are to be arranged.

Figure 7C:
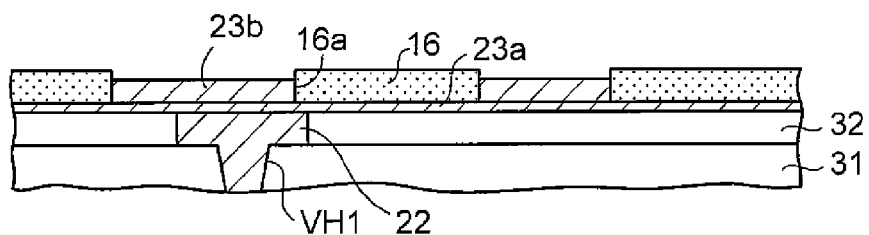
Figure 7D:
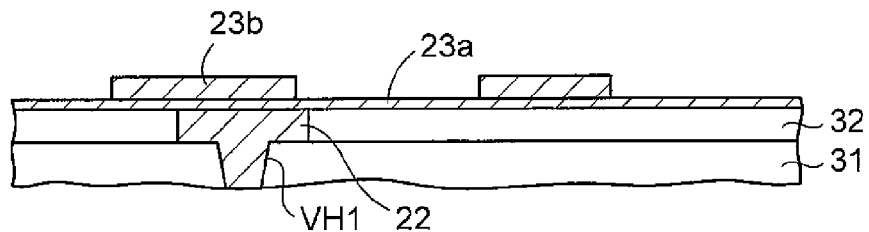

Thereafter, as depicted in FIG. 7C, a metal plating layer 23b made of copper or the like is formed in the opening portions 16a of the plating resist layer 16 by electroplating utilizing the seed layer 23a as a plating power feeding path. Then, as depicted in FIG. 7D, the plating resist layer 16 is removed.

Figure 7E:
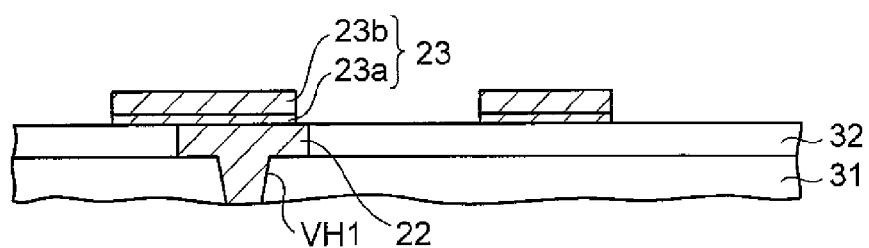

Further, as depicted in FIG. 7E, the seed layer 23a is removed by anisotropic dry etching while using the metal plating layer 23b as a mask.

The anisotropic dry etching is performed by a dry etching apparatus which is RIE (Reactive Ion Etching) apparatus, ICP (Inductively Coupled Plasma) apparatus, or the like.

By employing the anisotropic dry etching, narrowing of the metal plating layer 23b can be suppressed minutely and also there is no case that the seed layer 23a is side-etched from a lower end of the metal plating layer 23b to an inner side thereof. Moreover, by employing the sputtering, it is possible to make the seed layer 23a thin, therefore the miniaturization of the wiring becomes advantageous.

By the above steps, the third wiring layers 23 are formed form the seed layer 23a and the metal plating layer 23b.

In this way, the fine third wiring layer 23 in which line (width):space (interval) ratio is 2 μm:2 μm to 3 μm:3 μm can be formed within the design specifications at a good yield. The thickness of the third wiring layers 23 is set within a range of 1 μm to 5 μm, and preferably is set to the thin film in 2 μm to 3 μm.

In the case that the seed layer 23a is formed of copper, since the copper chloride produced during the drying etching has low volatility, it is preferable to perform the etching in a high-temperature atmosphere by setting the temperature of a stage of the etching apparatus to 100° C. to 200° C.

As described above, in order to form fine third wiring layers 23, it is preferable to remove the seed layer 23a by the anisotropic drying etching. However, by using a spin etching apparatus of a single wafer processing or the like, even if wet etching is employed, the seed layer 23a can be removed accurately to some extent.

In this way, the wiring pitch of the third wiring layers 23 can be set narrower than the wiring pitches of the first and second wiring layers 21 and 22 of the first multi-layer wiring layer 5.

Meanwhile, in the case of removing the seed layer 23a by the anisotropic dry etching when forming the third wiring layers 23, the width of the seed layer 23a becomes equal to or wider than the width of the metal plating layer 23b. In the example of FIG. 7E, the width of the seed layer 23a is equal to the width of the metal plating layer 23b.

Then, referring back to FIG. 6B, a photosensitive resin (not depicted) is formed on an upper face of the structure in FIG. 6A, the exposure and the development are performed on the basis of the photolithography, and then the photosensitive resin is cured by a heat process. The photosensitive resin may be formed by coating a liquid resin or attaching a thin resin film.

BY this matter, a third interlayer insulating layer 33 is formed in which second via holes VH2 are arranged on the third wiring layers 23. In this step, the third interlayer insulating layer 33 is formed to be opened such that the periphery part on the first multi-layer wiring layer 5 where the external connection pads P are arranged is exposed collectively.

In the case of using a negative-type photosensitive resin, the periphery part of the first multi-layer wiring layer 5 should be a non-light-exposed part. On the other hand, in the case of using a positive-type photosensitive resin, the periphery part of the first multi-layer wiring layer 5 should be a light-exposed part.

By patterning a photosensitive resin which does not contain inorganic filler which is silica or the like by means of the photolithography, it is possible to form the thin third interlayer insulating layer 33 having the fine second via holes VH2. The thickness of the third interlayer insulating layer 33 is set within a range of 1 µm to 5 µm and preferably 2 µm to 3 µm.

Moreover, the diameter of the second via holes VH2 formed in the third interlayer insulating layer 33 is set to 70 µm, for example.

As one preferred example of the third interlayer insulating layer 33, a permanent resist layer is used which is formed of a phenol-based resin having photosensitivity. A similar material and a similar formation method are employed also when forming the other interlayer insulating layers to be mentioned below.

In this way, by patterning the photosensitive resin by means of the photolithography, the interlayer insulating layer can be made thin and the via holes can be made narrow as compared with the technique in which the resin layer is processed by the laser. Thus, it is possible to form the interlayer insulating layer for constituting fine multi-layer wiring layer.

Then, as depicted in FIG. 8A, fourth wiring layers 24 are formed on the third interlayer insulating layer 33, the fourth wiring layers 24 which is connected to the third wiring layers 23 through via conductors in the second via holes VH2.

Figure 9A:
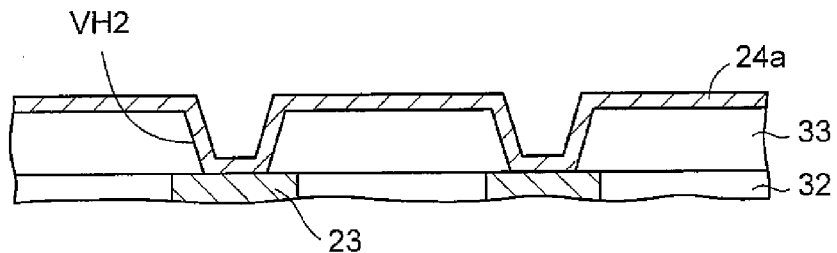
FIGS. 9A to 9E are cross-sectional views depicting the method of manufacturing a wiring substrate of the embodiment (part 8).
Figure 10:
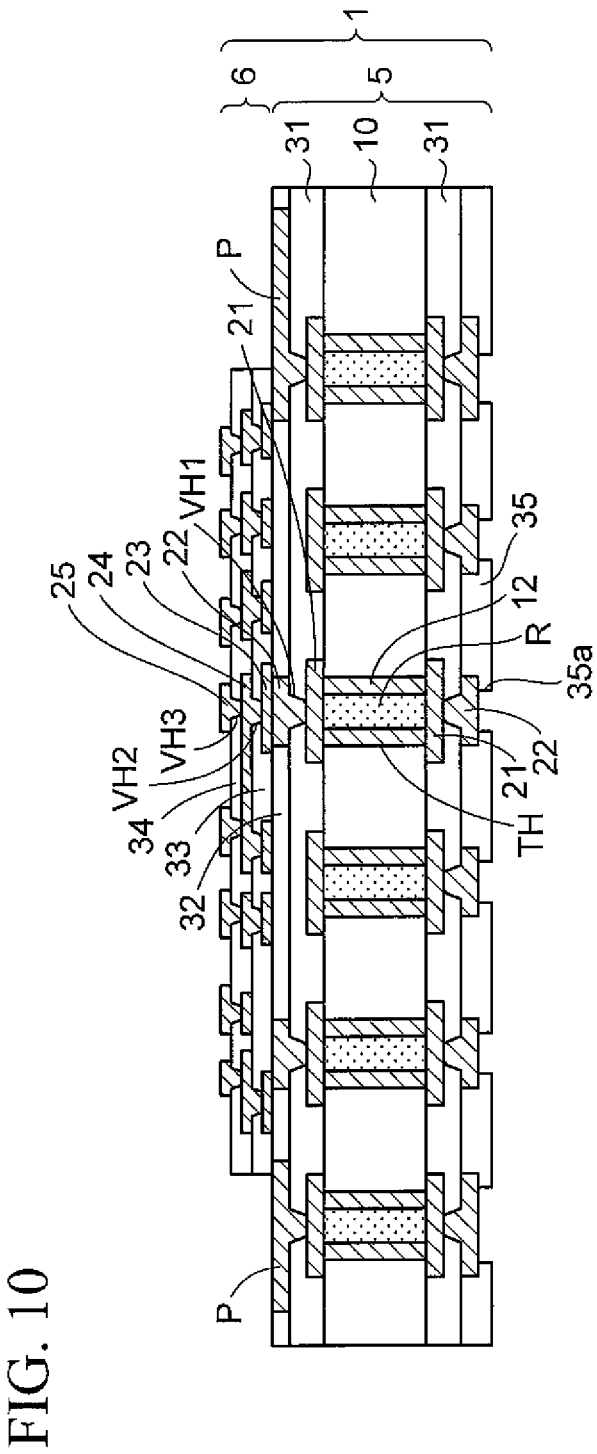
FIG. 10 is a cross-sectional view depicting a wiring substrate of the embodiment.

As explained in detail, as depicted in FIG. 9A, by a method similar to the step in FIG. 7A mentioned above, a seed layer 24a is formed on the third interlayer insulating layer 33 and inner faces of the second via holes VH2 by sputtering.

Figure 9B:
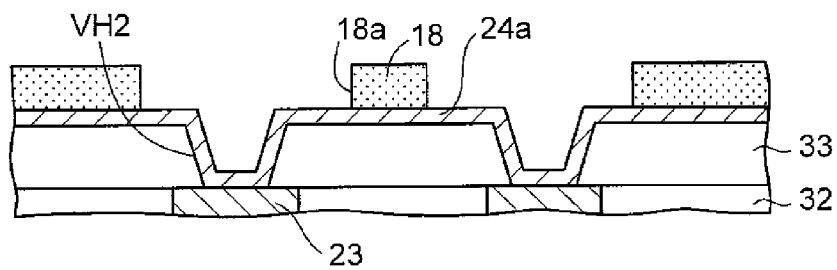

Then, as depicted in FIG. 9B, similarly to the step in FIG. 7B mentioned above, a plating resist layer 18 is formed in which opening portions 18a are provided on parts of the seed layer 24a where the fourth wiring layers 24 are to be arranged.

Figure 9C:
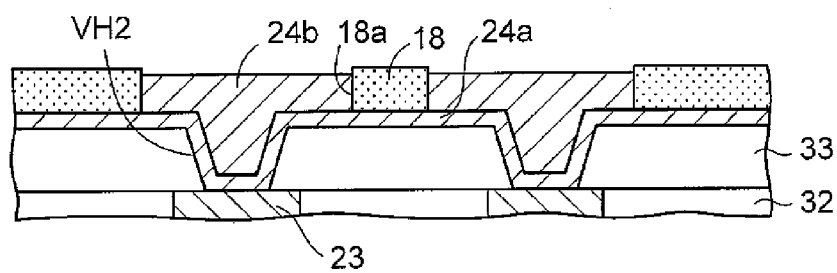
Figure 9D:
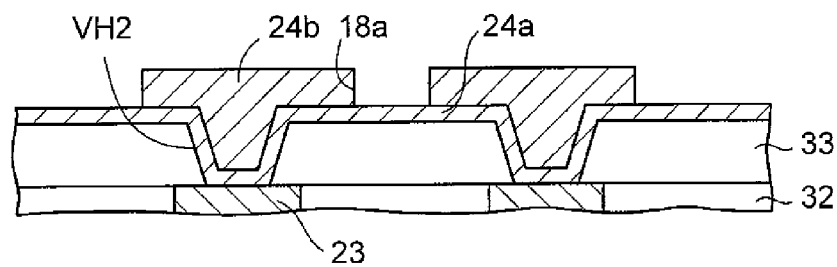

Thereafter, as depicted in FIG. 9C, similarly to the step in FIG. 7C mentioned above, a metal plating layer 24b is formed in the opening portions 18a of the plating resist layer 18 by electroplating utilizing the seed layer 24a as the plating power feeding path. Then, as depicted in FIG. 9D, the plating resist layer 18 is removed.

Figure 9E:
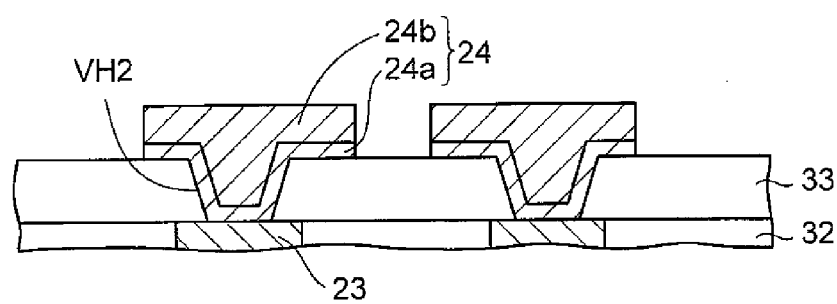

Further, as depicted in FIG. 9E, similarly to the step in FIG. 7E mentioned above, the seed layer 24a is removed by anisotropic dry etching while using the metal plating layer 24b as the mask.

By the above steps, the fourth wiring layers 24 are formed from the seed layer 24a and the metal plating layer 24b. The fourth wiring layers 24 are formed by the semi-additive method similar to the method of forming the third wiring layers 23 mentioned above. Therefore, the fourth wiring layers 24 are formed as fine wirings in which line (width):space (interval) ratio is about 2 µm:2 µm to 3 µm:3 µm.

Then, referring back to FIG. 8B, a fourth interlayer insulating layer 34 is formed on the third interlayer insulating layer 33, the fourth interlayer insulating layer 34 in which third via holes VH3 are arranged on connection parts of the fourth wiring layers 24. The fourth interlayer insulating layer 34 is formed by patterning the photosensitive resin on the basis of the photolithography similarly to the step in FIG. 6B mentioned above.

Similarly to the third interlayer insulating layer 33, the fourth interlayer insulating layer 34 is also formed to be opened such that the periphery part on the first multi-layer wiring layer 5 where the external connection pads P are arranged is exposed collectively.

Then, as depicted in FIG. 10, fifth wiring layers 25 are formed on the fourth interlayer insulating layer 34, the fifth wiring layers 25 which are connected to the fourth wiring layers 24 through via conductors in the third via holes VH3. The fifth wiring layers 25 are also formed as fine wirings by the semi-additive method similar to the formation of the third and fourth wiring layers 23 and 24.

By this matter, a second multi-layer wiring layer 6 in which the third to fifth wiring layers 23, 24, and 25 are stacked through the third and fourth interlayer insulating layers 33 and 34 is made on the first multi-layer wiring layer 5.

Further, a solder resist layer 35 is formed on the first interlayer insulating layer 31 on the lower face side of the first multi-layer wiring layer 5, the solder resist layer 35 in which opening portions 35a are provided on connection parts of the second wiring layers 22.

By the above steps, as depicted in FIG. 10, a wiring substrate 1 of the embodiment is manufactured. The wiring substrate 1 includes the first multi-layer wiring layer 5 in FIG. 5 mentioned above and the second multi-layer wiring layer 6 stacked thereon. In the first multi-layer wiring layer 5, the first interlayer insulating layers 31 are formed respectively on both face sides of the core substrate 10 in FIG. 2A mentioned above, the first interlayer insulating layers 31 in which the first via holes VH1 reaching the first wiring layers 21 are arranged.

The second wiring layers 22 are formed on the first interlayer insulating layers 31 on both face sides respectively and connected to the first wiring layers 21 through the first via holes VH1. The external connection pads P formed from the same layer as the second wiring layers 22 are arranged in a periphery part of the first interlayer insulating layer 31 on the upper face side.

The second interlayer insulating layer 32 is formed to lateral sides of the second wiring layers 22 and the external connection pads P on the upper face side, and the second wiring layers 22 and the external connection pads P are buried in the second interlayer insulating layer 32.

A whole of respective side faces and respective lower faces of the second wiring layers 22 and the external connection pads P contact the second interlayer insulating layer 32, and respective upper faces of the second wiring layers 22 and the external connection pads P are exposed from the second interlayer insulating layer 32. Thus, respective upper faces of the second wiring layers 22 and the external connection pads P, and the upper face of the second interlayer insulating layer 32 constitute an identical face.

Moreover, the solder resist layer 35 is formed on the first interlayer insulating layer 31 on the lower face side of the core substrate 10, the solder resist layer 35 in which the opening portions 35a are provided on the connection parts of the second wiring layers 22.

As explained in the manufacturing method mentioned above, when the first multi-layer wiring layer 5 is manufactured, general buildup method is employed. That is, via holes are formed in the interlayer insulating layer made of the non-photosensitive resin by the laser, then in the semi-additive method for forming wiring layers, the seed layer is formed by the electroless plating, and the removal of the seed layer is performed by wet etching.

For this reason, in line (width):space (interval) ratio as the design rule for the wiring layers of the first multi-layer wiring layer 5, about 10 μm:10 μm is a limit value. therefore, it is difficult to connect a semiconductor chip having narrow-pitch connection terminals.

To solve this, by using the technique capable of forming fine wirings, the second multi-layer wiring layer 6 is formed on the first multi-layer wiring layer 5. When forming the second multi-layer wiring layer 6, the photosensitive resin is patterned by the photolithography to form the interlayer insulating layer having fine via holes.

Moreover, in the semi-additive method for forming wiring layers, the seed layer of the thin film is formed by sputtering, and the removal of the seed layer is performed by anisotropic dry etching.

By this matter, as the design rule for the wiring layer of the second multi-layer wiring layer 6, line (width):space (interval) ratio can be made to the miniaturization in about 2 μm:2 μm to 3 μm:3 μm. In this way, it is possible to respond to the connection of the semiconductor chip having narrow-pitch connection terminals.

In the second multi-layer wiring layer 6, the third wiring layers 23, the fourth wiring layers 24, and the fifth wiring layers 25 are stacked through the third interlayer insulating layer 33 and the fourth interlayer insulating layer 34. The lowermost third wiring layers 23 of the second multi-layer wiring layer 6 are connected to the uppermost second wiring layers 22 of the first multi-layer wiring layer 5 directly through no via holes.

Moreover, the fourth wiring layers 24 are connected to the third wiring layers 23 through the second via holes VH2 of the third interlayer insulating layer 33. Further, the fifth wiring layers 25 are connected to the fourth wiring layers 24 through the third via holes VH3 of the fourth interlayer insulating layer 34.

In this way, the second multi-layer wiring layer 6 is arranged on the second interlayer insulating layer 32 of the first multi-layer wiring layer 5, in a state that the lowermost third wiring layers 23 of the second multi-layer wiring layer 6 is connected to the second wiring layers 22 of the first multi-layer wiring layer 5.

Moreover, the third interlayer insulating layer 33 and the fourth interlayer insulating layer 34 of the second multi-layer wiring layer 6 are opened such that the periphery part of the first multi-layer wiring layer 5 where the external connection pads P are arranged is exposed collectively.

Next, a method of flip-chip connecting semiconductor chips to the second multi-layer wiring layer 6 of the wiring substrate 1 of this embodiment will be explained.

As mentioned above, the third to fifth wiring layers 23, 24, and 25 of the second multi-layer wiring layer 6 are formed with narrower pitches than the pitches of the first and second wiring layers 21 and 22 of the first multi-layer wiring layer 5. For this reason, it is possible to mount high-performance semiconductor chip having narrow-pitch connection terminals.

For example, only a semiconductor chip in which the arrangement pitch of connection terminals is about 130 μm or more can be mounted on the first multi-layer wiring layer 5. On the other hand, by forming the second multi-layer wiring layer 6 including fine wirings on the first multi-layer wiring layer 5, a semiconductor chip in which the arrangement pitch of connection terminals is about 40 μm can be mounted.

Further, with the advancement in the performance of logic LSIs which are CPU chips or the like, their sizes are reduced. Therefore, two semiconductor chips can be mounted side by side on the region on the first multi-layer wiring layer 5 where one semiconductor chip has been mounted.

Figure 11:
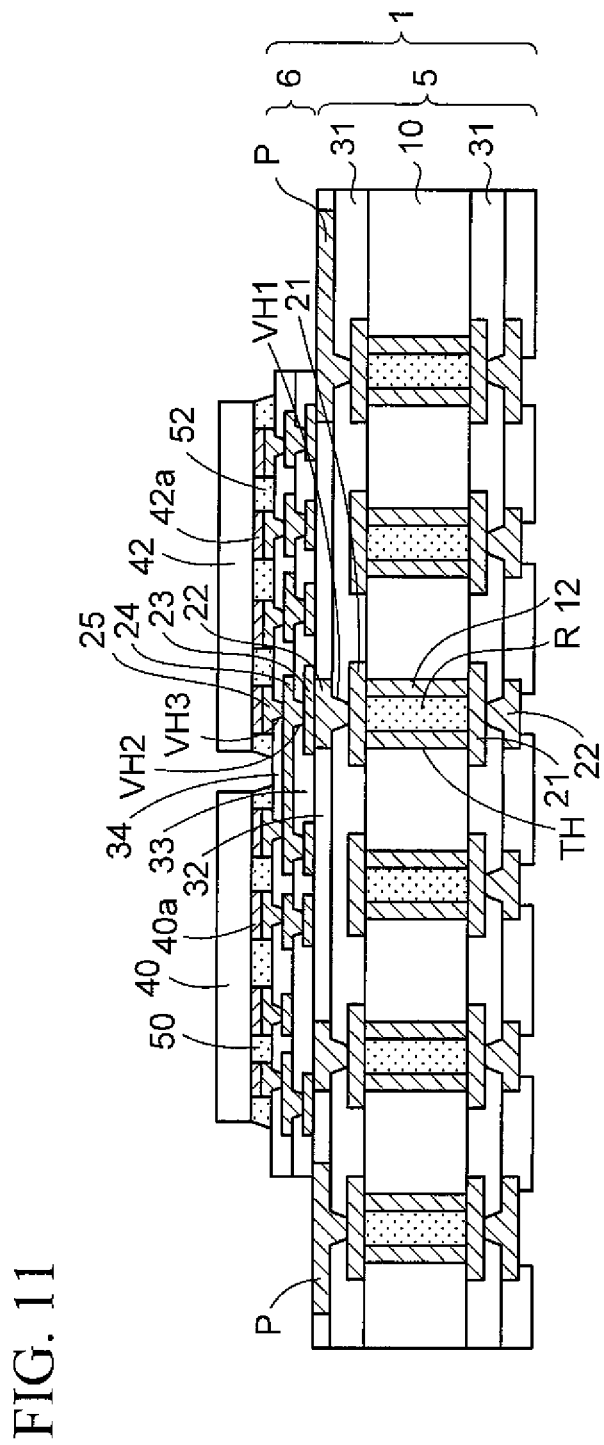
FIG. 11 is a cross-sectional view depicting a method of manufacturing a semiconductor device by using the wiring substrate of the embodiment (part 1).

As depicted in FIG. 11, connection terminals 40a of a first semiconductor chip 40 are flip-chip connected to connection parts of the fifth wiring layers 25 of the second multi-layer wiring layer 6 in the wiring substrate 1 of the embodiment through solder layers. Also similarly, connection terminals 42a of a second semiconductor chip 42 are flip-chip connected to connection parts of the fifth wiring layers 25 of the second multi-layer wiring layer 6 in the wiring substrate 1 through solder layers.

The first semiconductor chip 40 and the second semiconductor chip 42 are arranged side by side in a lateral direction on the second multi-layer wiring layer 6. Then, the first semiconductor chip 40 and the second semiconductor chip 42 are electrically connected each other through the fifth wiring layers 25 and the fourth wiring layers 24 of the second multi-layer wiring layer 6.

Further, a first underfill resin 50 is filled between the first semiconductor chip 40 and the second multi-layer wiring layer 6. Also similarly, a second underfill resin 52 is filled between the second semiconductor chip 42 and the second multi-layer wiring layer 6.

In this embodiment, two semiconductor chips are flip-chip connected side by side on the second multi-layer wiring layer 6. However, one semiconductor chip may be mounted on the second multi-layer wiring layer 6, or plural semiconductor chips of arbitrary number may be arranged side by side.

Figure 12:
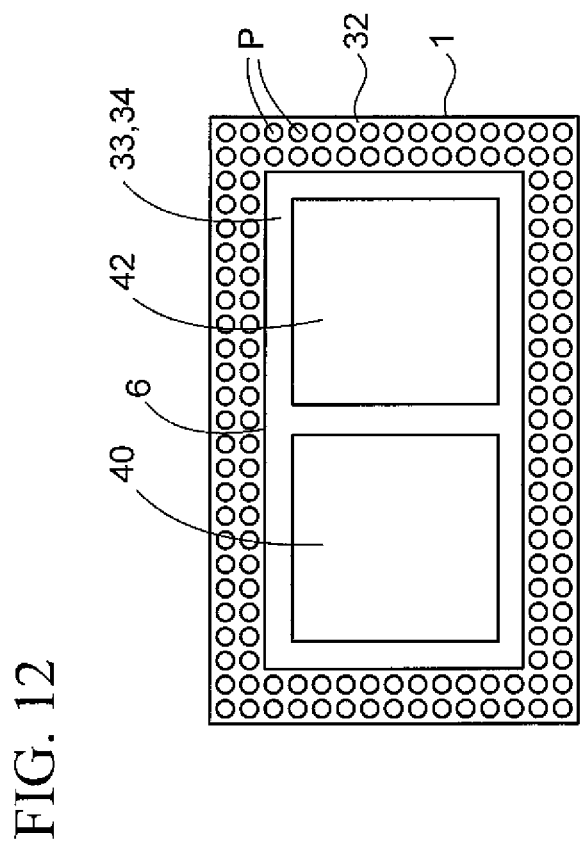
FIG. 12 is a reduced plan view in which the structure in FIG. 11 is seen from the upper side.

FIG. 12 is a schematic reduced plan view in which the structure in FIG. 11 is seen from upper side. FIG. 12 depicts an example in which the external connection pads P of the first multi-layer wiring layer 5 are arranged side by side in two lines, and is different from FIG. 11.

As depicted in FIG. 12, the first semiconductor chip 40 and the second semiconductor chip 42 are arranged side by side on the second multi-layer wiring layer 6 of the wiring substrate 1.

The third and fourth interlayer insulating layers 33 and 34 of the second multi-layer wiring layer 6 are opened collectively on the periphery part of the first multi-layer wiring layer 5, and the whole of the periphery part of the first multi-layer wiring layer 5 is exposed from the second multi-layer wiring layer 6.

By this matter, it is in a state that the plurality of external connection pads P arranged side by side in the periphery part of the first multi-layer wiring layer 5 are exposed from the third and fourth interlayer insulating layers 33 and 34 of the second multi-layer wiring layer 6.

Since no fine wirings are formed in the first multi-layer wiring layer 5, the external connection pads P are formed from the same layer as the second wiring layers 22 having a wide wiring pitch and are formed with a thickness of about 10 μm. For this reason, the external connection pads P can be formed as pads having strong mechanical strength.

Unlike this embodiment, if external connection pads are formed at the same time as when the wiring layers of the second multi-layer wiring layer 6 are formed, the external connection pads are formed as pads of thin film having a thickness of 2 μm to 3 μm. Therefore, to use as the external connection pads P, the mechanical strength becomes weak.

For this reason, when an upper wiring substrate is connected to the external connection pads through solder bumps, cracking or the like of the external connection pads may easily occur, thus the reliability of the connection cannot be obtained.

Moreover, in the first multi-layer wiring layer 5, the external connection pads P are buried in the second interlayer insulating layer 32, and the upper faces of the external connection pads P and the upper face of the second interlayer insulating layer 32 constitute an identical face.

When the upper wiring substrate is connected to the external connection pads P through solder balls or the like, since the second interlayer insulating layer 32 (resin) has low solder wettability, there is no fear that the solder flows out from the upper faces of the external connection pads P to peripheral regions.

For this reason, it is not necessary to provide a solder resist layer in which the opening portions for damming up the solder are arranged on the external connection pads, thus the structure can be simple.

Figure 13:
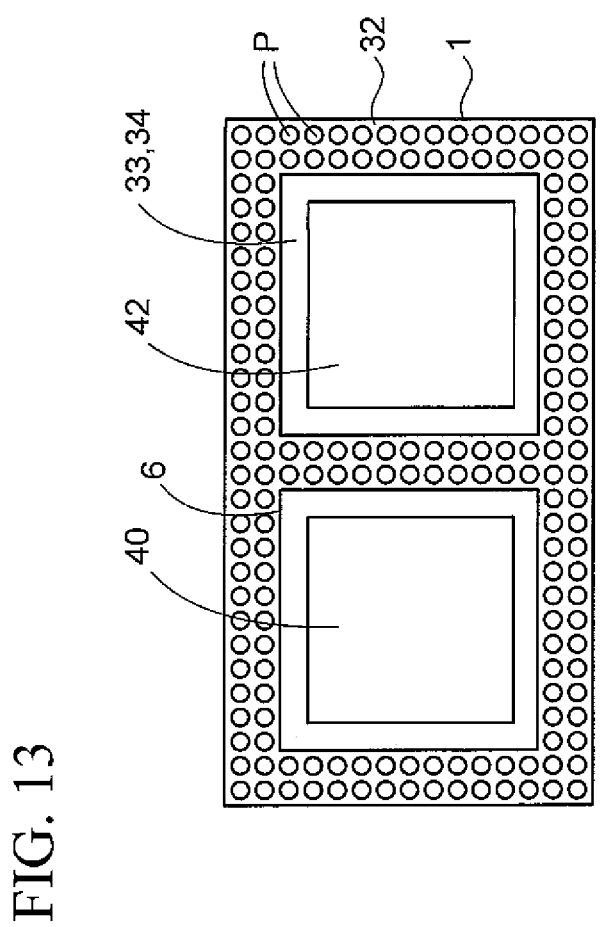
FIG. 13 is a plan view depicting a mode in which external connection pads are arranged also in a region between two semiconductor chips in FIG. 12.

Meanwhile, as depicted in FIG. 13, in FIG. 12, the external connection pads P may be arranged also in a region between the first semiconductor chip 40 and the second semiconductor chip 42. Then, similarly to FIG. 12, the external connection pads P around the first semiconductor chip 40 and the second semiconductor chip 42 may be collectively exposed from the second multi-layer wiring layer 6.

Figure 14:
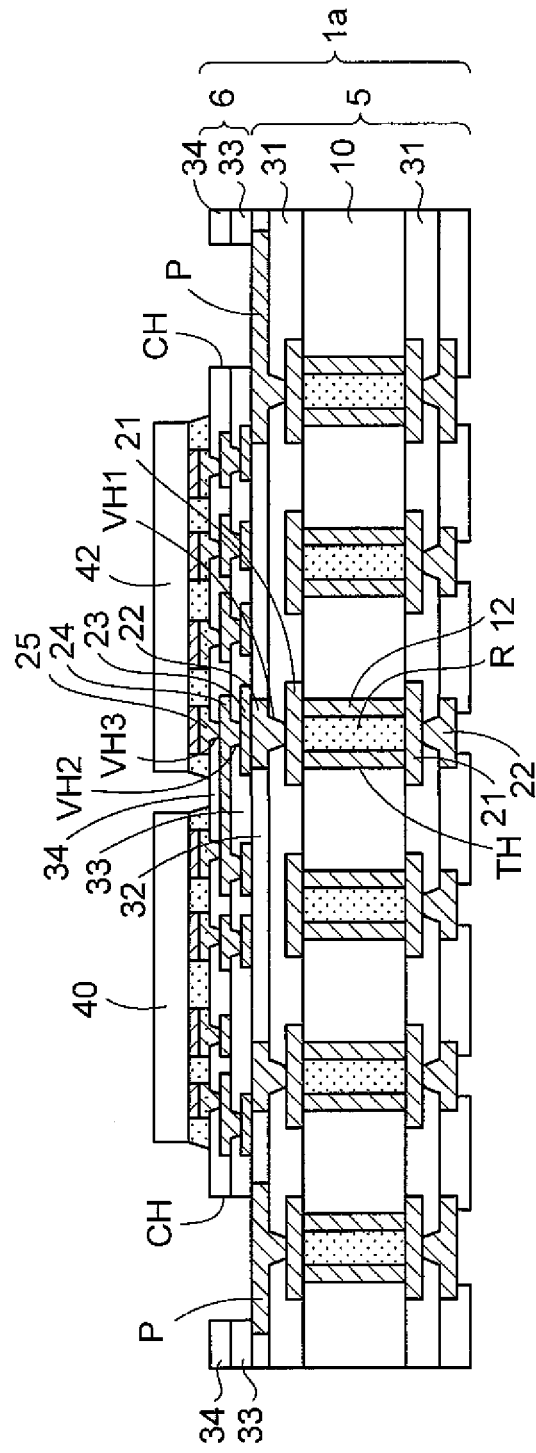
FIG. 14 is a cross-sectional view depicting the method of manufacturing a semiconductor device by using the wiring substrate of the embodiment (part 2).
Figure 15:
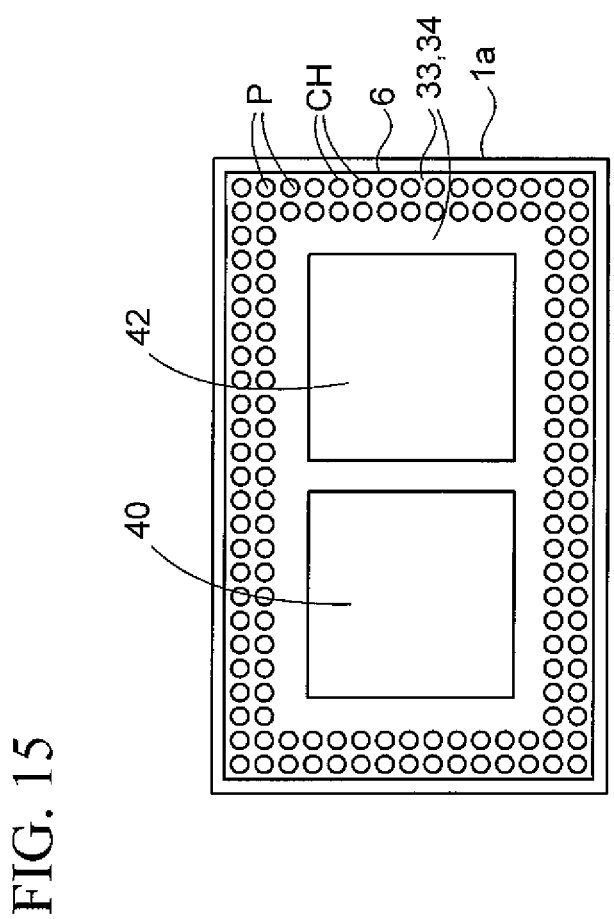
FIG. 15 is a reduced plan view in which the structure in FIG. 14 is seen from upper side.

FIG. 14 depicts a state that two semiconductor chips are flip-chip connected in a similar manner to a wiring substrate 1a of a modification of the embodiment. FIG. 15 is a schematic reduced plan view in which the structure in FIG. 14 is seen from upper side.

As depicted in FIG. 14 and FIG. 15, in the wiring substrate 1a of the modification, a plurality of connection holes CH are arranged in the third interlayer insulating layer 33 and the fourth interlayer insulating layer 34 respectively so as to correspond to respective external connection pads P of the first multi-layer wiring layer 5. The external connection pads P are exposed in bottom faces of the respective connection holes CH.

In the wiring substrate 1a of the modification, unlike the wiring substrate 1 in FIG. 11, the third interlayer insulating layer 33 and the fourth interlayer insulating layer 34 of the second multi-layer wiring layer 6 are left in a region between adjacent external connection pads P and the outermost periphery part.

In this way, also in the wiring substrate 1a of the modification, the external connection pads P of the first multi-layer wiring layer 5 are exposed from the third and fourth interlayer insulating layers 33 and 34 of the second multi-layer wiring layer 6.

By arranging the connection holes CH on respective external connection pads P, even when the pitch of the external connection pads P is narrowed and also large solder balls are employed, it is possible to dam up the solder within the connection holes CH. Thus, short circuit between the external connection pads P can be prevented.

Figure 16:
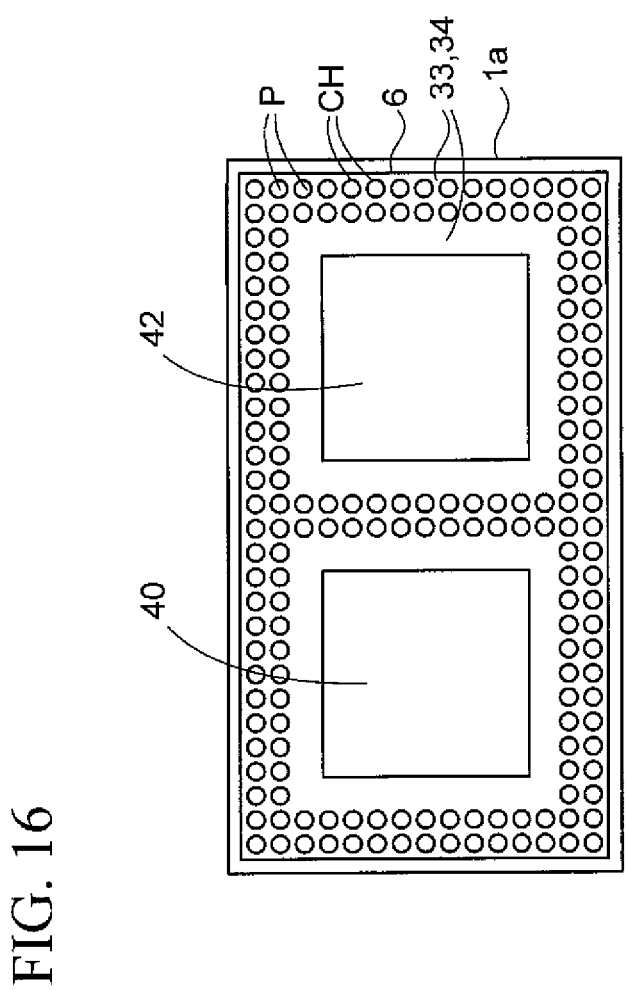
FIG. 16 is a plan view depicting an example where external connection pads are arranged also in a region between two semiconductor chips in FIG. 15.

Furthermore, as depicted in FIG. 16, in FIG. 15, the external connection pads P may be arranged also in the region between the first semiconductor chip 40 and the second semiconductor chip 42. Then, similarly to FIG. 15, the connection holes CH of the second multi-layer wiring layer 2 may be arranged on respective external connection pads P around the first semiconductor chip 40 and the second semiconductor chip 42.

Next, a method of connecting the upper wiring substrate and a third semiconductor chip onto the wiring substrate 1 in FIG. 11 mentioned above will be explained. The upper wiring substrate is manufactured as a third multi-layer wiring layer.

Figure 17:
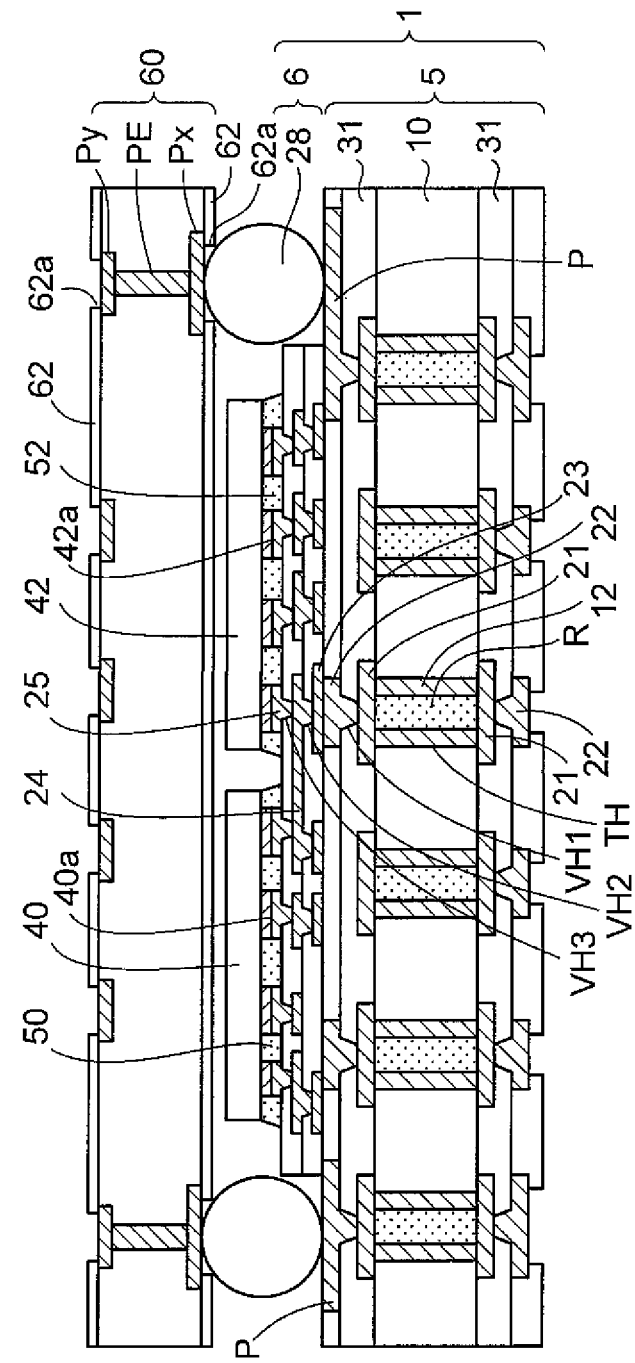
FIG. 17 is a cross-sectional view depicting the method of manufacturing a semiconductor device by using the wiring substrate of the embodiment (part 3).

First, as depicted in FIG. 17, an upper wiring substrate 60 is prepared. In the upper wiring substrate 60, lower connection pads Px and upper connection pads Py are formed, and penetrating electrodes PE are formed in the thickness direction.

The lower connection pads Px and the upper connection pads Py are connected each other through the penetrating electrodes PE. The upper wiring substrate 60 may include multi-layer wirings in the inside thereof, as long as it is the structure that the conduction of the upper and lower sides is possible, it can be employed.

Further, in the upper wiring substrate 60, solder resist layers 62 are formed respectively on both face sides as outermost layers, the solder resist layers 62 in which opening portions 62a are provided on the lower connection pads Px and the upper connection pads Py.

Then, solder balls 28 are mounted on the lower connection pads Px of the upper wiring substrate 60. Thereafter, the upper wiring substrate 60 is arranged on the wiring substrate 1 and the first and second semiconductor chips 40 and 42, such that the solder balls 28 of the upper wiring substrate 60 are arranged on the external connection pads P of the first multi-layer wiring layer 5.

Further, reflow heating is performed to connect the lower connection pads Px of the upper wiring substrate 60 to the external connection pads P of the first multi-layer wiring layer 5 through the solder balls 28.

The solder balls 28 may be mounted on the external connection pads P of the first multi-layer wiring layer 5. Instead of the solder balls 28, solder bumps may be formed by printing or the like.

By this matter, it is in a state that the first and second semiconductor chips 40 and 42 are housed in a lower region of the upper wiring substrate 60. A gap is provided between upper faces of the first and second semiconductor chips 40 and 42 and a lower face of the upper wiring substrate 60. The solder balls 28 are enumerated as a preferred example of bump electrodes, but various other conductive materials can be used.

Figure 18:
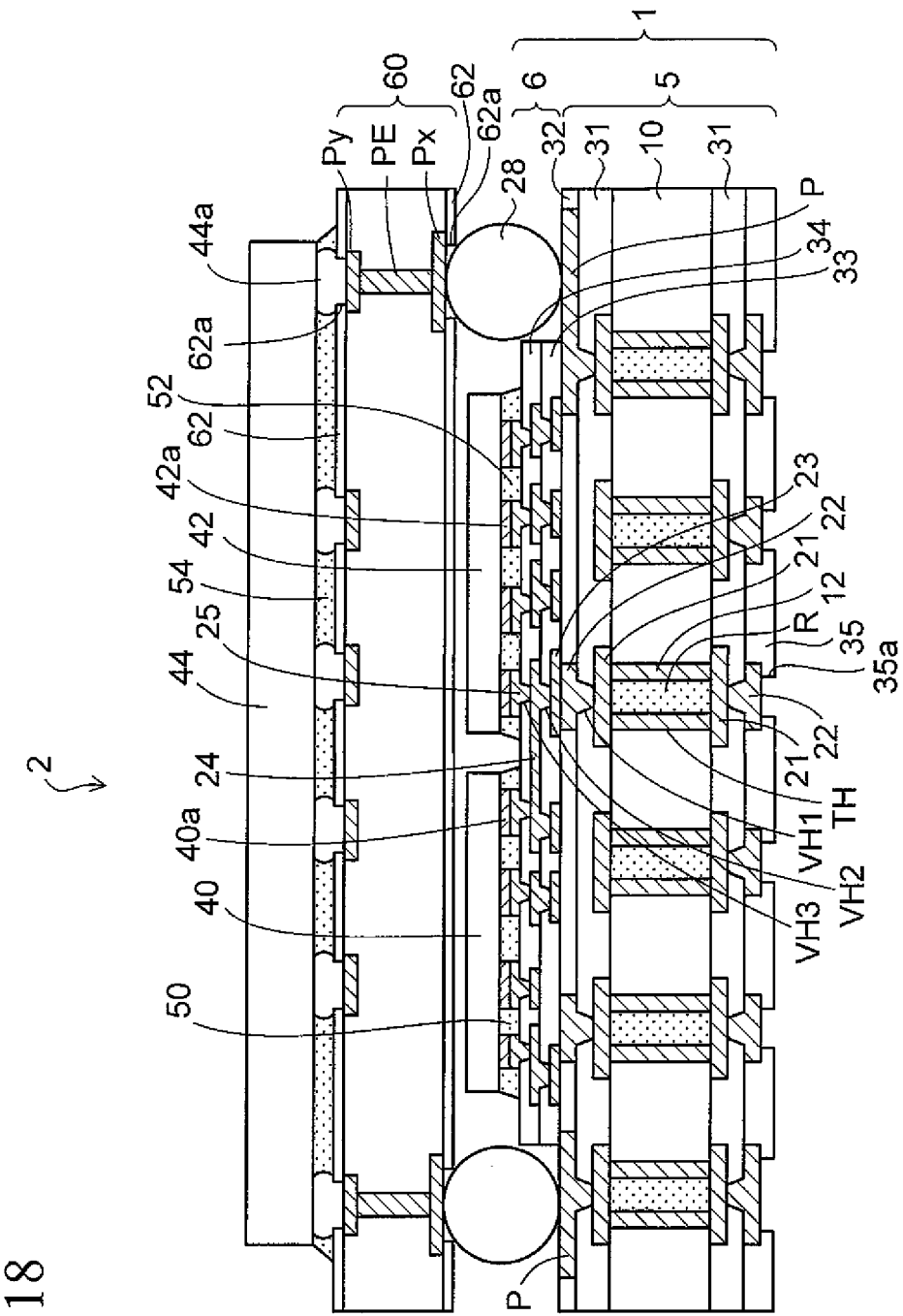
FIG. 18 is a cross-sectional view depicting a semiconductor device of the embodiment.

Thereafter, as depicted in FIG. 18, connection terminals 44a of a third semiconductor chip 44 are flip-chip connected to the upper connection pads Py of the upper wiring substrate 60 in FIG. 17 through solder layers. Then, a third underfill resin 54 is filled between the third semiconductor chip 44 and the upper wiring substrate 60. In the case that the first and second semiconductor chips 40 and 42 are CPU chips, a memory chip is used as the third semiconductor chip 44.

By the above steps, a semiconductor device 2 of the embodiment is obtained. In the case of using a large substrate for the multi production as the first multi-layer wiring layer 5, the upper wiring substrate 60 and the first multi-layer wiring layer 5 are cut, thus individual semiconductor devices 2 are obtained. Alternatively, after the step in FIG. 11 mentioned above, the wiring substrate 1 on which the first and second semiconductor chips 40 and 42 are mounted may be cut.

As depicted in FIG. 18, in the semiconductor device 2, the first semiconductor chip 40 and the second semiconductor chip 42 are flip-chip connected side by side onto the second multi-layer wiring layer 6 of the wiring substrate 1 explained in FIG. 10.

The first semiconductor chip 40 and the second semiconductor chip 42 are connected each other through the fifth wiring layers 25 and the fourth wiring layers 24 of the second multi-layer wiring layer 6. The first underfill resin 50 is filled between the first semiconductor chip 40 and the second multi-layer wiring layer 6.

Also similarly, the second underfill resin 52 is filled between the second semiconductor chip 42 and the second multi-layer wiring layer 6.

The upper wiring substrate 60 is arranged on the wiring substrate 1 and the first and second semiconductor chips 40 and 42 through the solder balls 28. The connection terminals 44a of the third semiconductor chip 44 are flip-chip connected to the upper connection pads Py of the upper wiring substrate 60. The third underfill resin 54 is filled between the third semiconductor chip 44 and the upper wiring substrate 60.

The first semiconductor chip 40 and the second semiconductor chip 42 are electrically connected to the third semiconductor chip 44 through the second multi-layer wiring layer 6, the first multi-layer wiring layer 5, the solder balls 28, and the upper wiring substrate 60.

Figure 19:
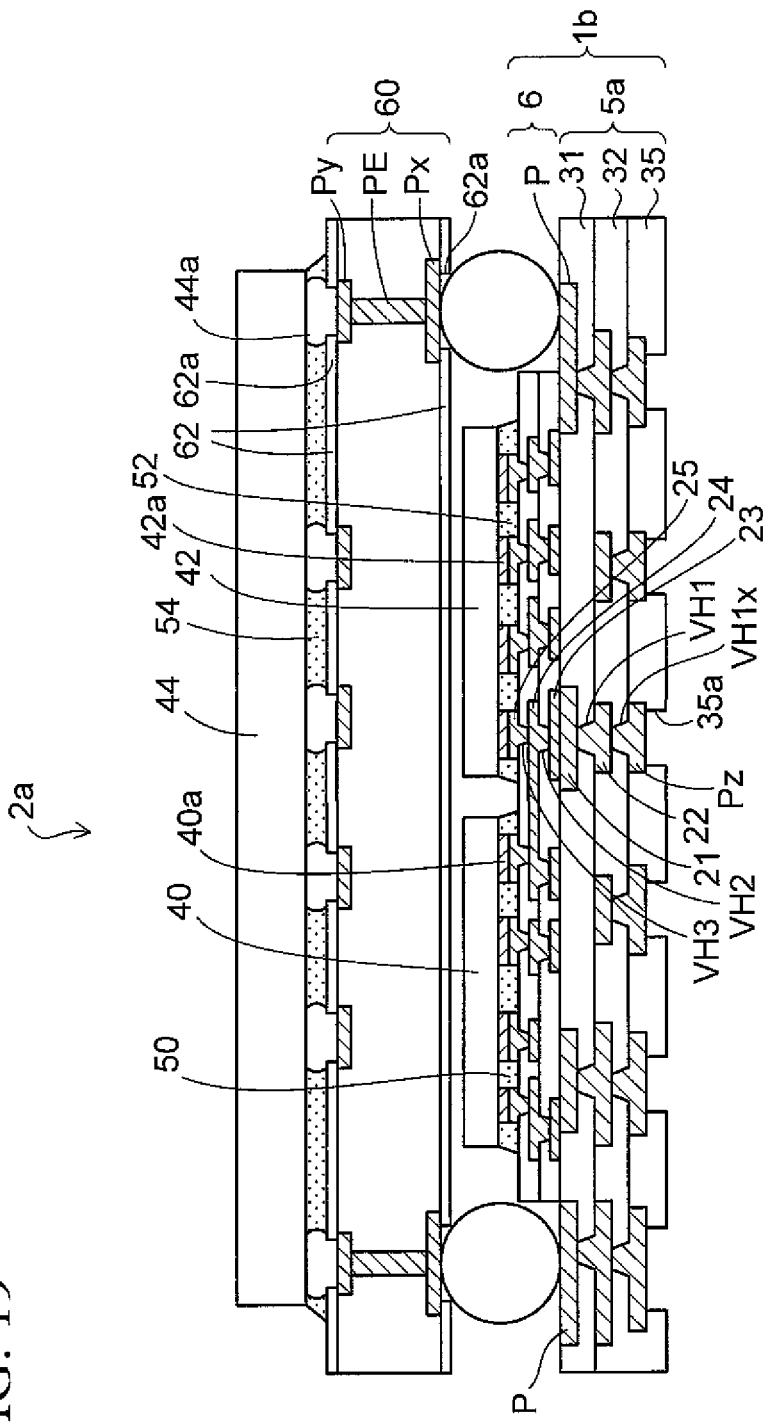
FIG. 19 is a cross-sectional view depicting a semiconductor device of a first modification of the embodiment.

FIG. 19 depicts a semiconductor device 2a of a first modification of the embodiment. The semiconductor device 2a of the first modification differs from the semiconductor device 2 in FIG. 18 in that a core-less-type first multi-layer wiring layer 5a which does not include the core substrate 10 is used instead of using the first multi-layer wiring layer 5 formed of a buildup wiring substrate including the core substrate 10.

In this way, in the semiconductor device 2a of the first modification, a core-less wiring substrate is used as the first multi-layer wiring layer 5a. Then, a similar second multi-layer wiring layer 6 is stacked on the core-less-type first multi-layer wiring layer 5a.

The core-less-type first multi-layer wiring layer 5a in FIG. 19 is manufactured by forming a multi-layer wiring layer on a temporary substrate and then removing the temporary substrate. In FIG. 19, the second multi-layer wiring layer 6 is stacked on the face of the multi-layer wiring layer that is separated from the temporary substrate.

In the core-less-type first multi-layer wiring layer 5a in FIG. 19, similarly to the first multi-layer wiring layer 5 in FIG. 18, first wiring layers 21 and external connection pads P are buried in an uppermost first interlayer insulating layer 31. Respective upper faces of the first wiring layers 21 and the external connection pads P, and an upper face of the first interlayer insulating layer 31 constitute an identical face.

Upper first via holes VH1 are formed in the first interlayer insulating layer 31 and reach the first wiring layers 21. Second wiring layers 22 are formed under the first interlayer insulating layer 31 and connected to the first wiring layers 21 through the upper first via holes VH1.

Moreover, a second interlayer insulating layer 32 is formed under the first interlayer insulating layer 31 and includes lower first via holes VH1x reaching the second wiring layers 22. Connection pads Pz are formed under the second interlayer insulating layer 32 and connected to the second wiring layers 22 through the lower first via holes VH1x.

A solder resist layer 35 is formed under the second interlayer insulating layer 32 and includes opening portions 35a that the connection pads Pz are exposed.

Then, the lowermost third wiring layers 23 of the second multi-layer wiring layer 6 are connected to the uppermost first wiring layers 21 of the core-less-type first multi-layer wiring layer 5a, thus a wiring substrate 1b is formed. The other elements in FIG. 19 are the same as those in FIG. 18, therefore the explanation thereof is omitted.

Figure 20:
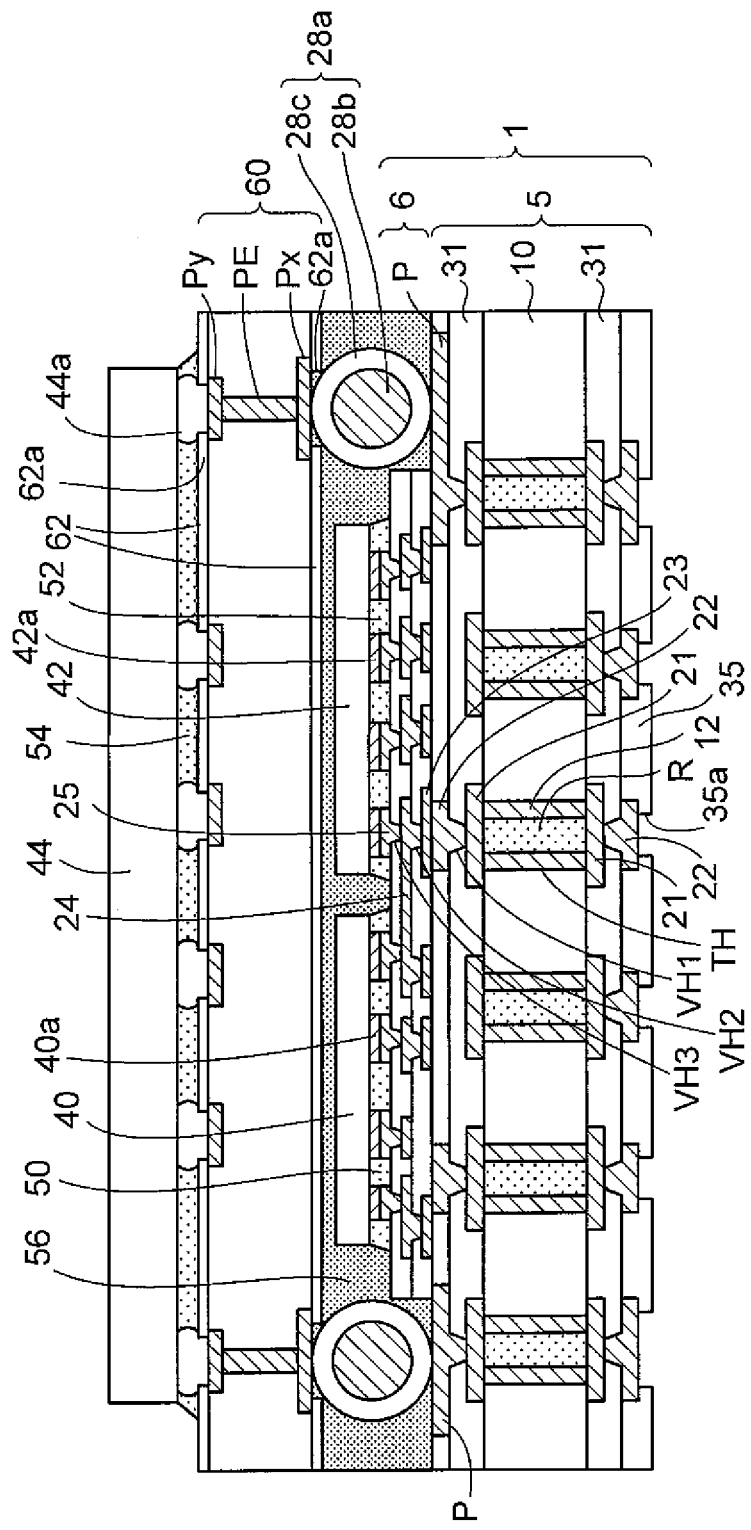
FIG. 20 is a cross-sectional view depicting a semiconductor device of a second modification of the embodiment.

FIG. 20 depicts a semiconductor device 2b of a second modification of the embodiment. As depicted in FIG. 20, in the semiconductor device 2b of the second modification, a mold resin 56 is filled between the wiring substrate 1 and the first and second semiconductor chips 40 and 42, and the upper wiring substrate 60, in the semiconductor device 2 in FIG. 18 mentioned above.

Moreover, as the solder balls to connect the wiring substrate 1 and the upper wiring substrate 60, copper-core solder balls 28a are employed in which a solder layer 28c is coated on an outer face of a copper core portion 28b. By employing the copper-core solder balls 28a, the copper core portions 4b do not reflow when reflow heating is performed to connect.

For this reason, even in the case of narrowing the gap between the first and second semiconductor chips 40 and 42, and the upper wiring substrate 60 to be made thin, the gap can be certainly ensured and sealed with the mold resin 56. The other elements in FIG. 20 are the same as those in FIG. 18, therefore the explanation thereof is omitted.

Figure 21:
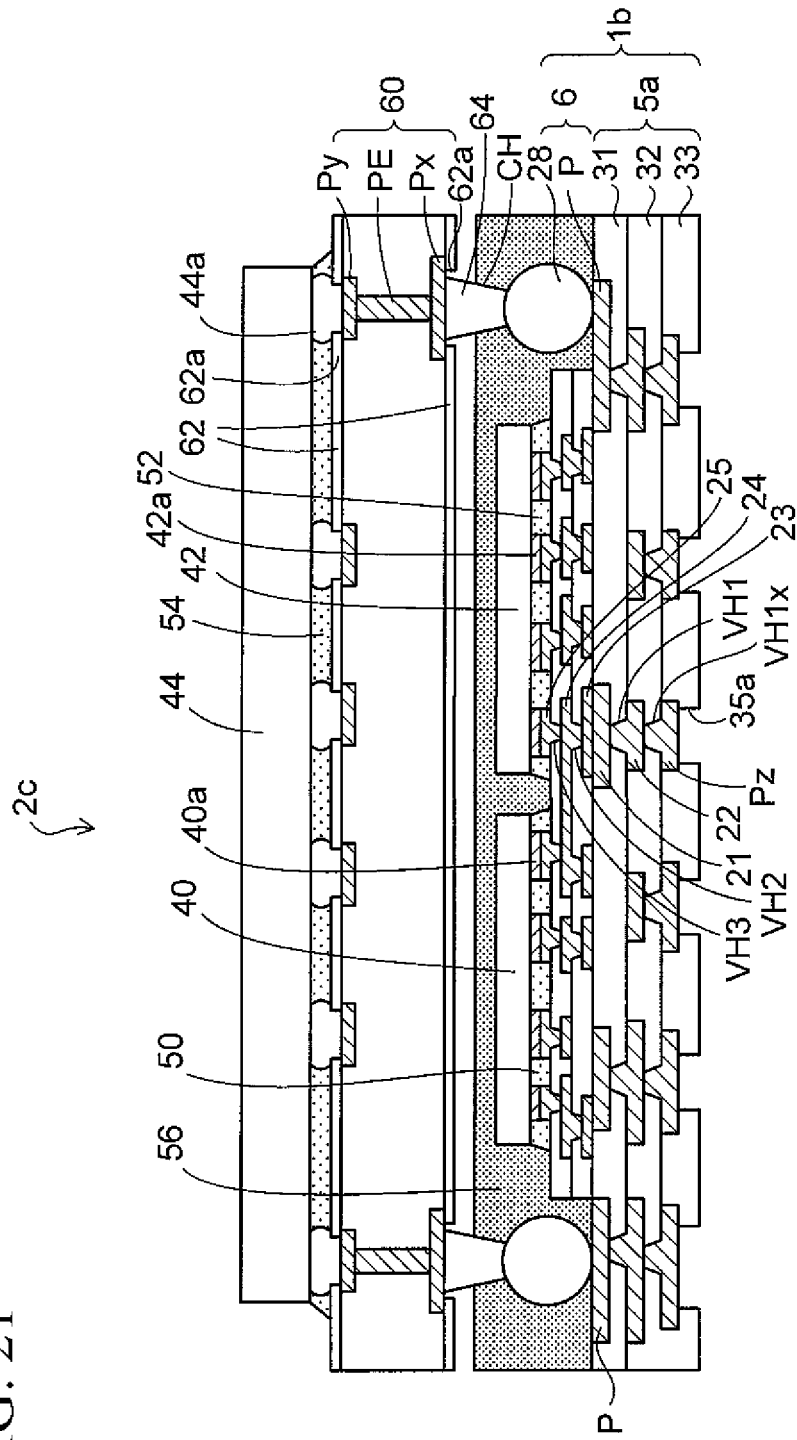
FIG. 21 is a cross-sectional view depicting a semiconductor device of a third modification of the embodiment.

Moreover, FIG. 21 depicts a semiconductor device 2c of a third modification of the embodiment. In the semiconductor device 2c of the third modification in FIG. 21, the wiring substrate 1b, the first and second semiconductor chips 40 and 42, and the solder balls 28 are sealed with a mold resin 56, in the semiconductor device 2a in FIG. 19 mentioned above. Then, connection holes CH are provided in the mold resin 56 on the solder balls 28.

Further, solder bumps 64 formed on the lower connection pads Px of the upper wiring substrate 60 are connected to the solder balls 28 in the connection holes CH of the wiring substrate 1b. A gap is provided between an upper face of the mold resin 56 and the lower face of the upper wiring substrate 60. The other elements in FIG. 21 are the same as those in FIG. 18, therefore the explanation thereof is omitted.

To manufacture the semiconductor device 2c of the third modification in FIG. 21, first, the solder balls 28 are mounted on the external connection pads P of the wiring substrate 1b in FIG. 19 mentioned above. Further, the wiring substrate 1b, the first and second semiconductor chips 40 and 42, and the solder balls 28 are sealed with the mold resin 56. Thereafter, the mold resin 56 on the solder balls 28 is processed by the laser to form the connection holes CH.

Then, the solder bumps 64 of the upper wiring substrate 60 are arranged on the solder balls 28 in the connection holes CH of the wiring substrate 1b. Further, reflow heating is performed to connect the wiring substrate 1b and the upper wiring substrate 60 through the solder balls 28 and the solder bumps 64.

The semiconductor devices 2a, 2b, and 2c of the first to third modifications of the embodiment in FIG. 19 to FIG. 21 achieve advantageous effects similar to the semiconductor device 2 of the embodiment in FIG. 18.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a wiring substrate, comprising:

forming a first multi-layer wiring layer including an external connection pad on an upper face side of the first multi-layer wiring layer, by a method including a technique in which a first via hole is formed in an insulating layer formed of a non-photosensitive resin by a laser; and forming a second multi-layer wiring layer on the first multi-layer wiring layer such that the external connection pad is exposed, by a method including a technique in which an insulating layer including a second via hole is formed by patterning a photosensitive resin by means of photolithography, wherein a wiring pitch of the second multi-layer wiring layer is set narrower than a wiring pitch of the first multi-layer wiring layer.

(Clause 2) The method of manufacturing a wiring substrate according to Clause 1, wherein, in the forming of the first multi-layer wiring layer, before the forming of the second multi-layer wiring layer, by polishing an upper face of the insulating layer of the first multi-layer wiring layer, the external connection pad is formed to be buried in the insulating layer of the first multi-layer wiring layer, such that an upper face of the external connection pad and the upper face of the insulating layer of the first multi-layer wiring layer constitute an identical face.

(Clause 3) The method of manufacturing a wiring substrate according to Clause 1, wherein, in the forming of the second multi-layer wiring layer, a connection hole is arranged in the insulating layer of the second multi-layer wiring layer on the external connection pad.

(Clause 4) The method of manufacturing a wiring substrate according to Clause 1, wherein the forming a wiring layer of the second multi-layer wiring layer including, forming a seed layer on the insulating layer of the second multi-layer wiring layer and an inner face of the second via hole;

forming a plating resist layer on the seed layer, the plating resist layer in which an opening portion is provided in a region including the second via hole;

forming a metal plating layer in the second via hole and the opening portion of the plating resist layer by electroplating utilizing the seed layer as a plating power feeding path;

removing the plating resist layer; and removing the seed layer by anisotropic dry etching while using the metal plating layer as a mask.

What is claimed is:

1. A wiring substrate, comprising:
   a first multi-layer wiring layer including an insulating layer formed of a non-photosensitive resin;
   a plurality of external connection pads formed on an upper face side of the first multi-layer wiring layer; and
   a second multi-layer wiring layer formed on the first multi-layer wiring layer, the second multi-layer wiring layer including an insulating layer formed of a photosensitive resin, the second multi-layer wiring layer having a wiring pitch narrower than a wiring pitch of the first multi-layer wiring layer, wherein
   the insulating layer of the second multi-layer wiring layer is formed to be opened such that the plurality of external connection pads are exposed.

2. The wiring substrate according to claim 1, wherein the external connection pads are buried in the insulating layer of the first multi-layer wiring layer, such that upper faces of the external connection pads and an upper face of the insulating layer of the first multi-layer wiring layer constitute an identical face.

3. The wiring substrate according to claim 1, wherein
   the insulating layer of the second multi-layer wiring layer includes a plurality of connection holes respectively corresponding to the external connection pads, and
   the external connection pads are exposed in bottom faces of the connection holes.

4. The wiring substrate according to claim 1, wherein the external connection pads are arranged in a periphery part of the first multi-layer wiring layer.

5. A semiconductor device, comprising:
   a wiring substrate including
   a first multi-layer wiring layer including an insulating layer formed of a non-photosensitive resin,
   a plurality of external connection pads formed on an upper face side of the first multi-layer wiring layer, and
   a second multi-layer wiring layer formed on the first multi-layer wiring layer, the second multi-layer wiring layer including an insulating layer formed of a photosensitive resin, the second multi-layer wiring layer having a wiring pitch narrower than a wiring pitch of the first multi-layer wiring layer,
   wherein the insulating layer of the second multi-layer wiring layer is formed to be opened such that the plurality of external connection pads are exposed; and
   a semiconductor chip flip-chip connected to the second multi-layer wiring layer.

6. The semiconductor device according to claim 5, further comprising,
   an upper wiring substrate arranged on the wiring substrate and the semiconductor chip, the upper wiring substrate connected to the external connection pads of the first multi-layer wiring layer through bump electrodes.

7. The semiconductor device according to claim 5, wherein a plurality of the semiconductor chips are arranged side by side on the second multi-layer wiring layer.

* * * * *